(12) United States Patent
Rabkin et al.

(10) Patent No.: US 10,297,329 B2
(45) Date of Patent: *May 21, 2019

(54) NAND BOOSTING USING DYNAMIC RAMPING OF WORD LINE VOLTAGES

(71) Applicant: SanDisk Technologies LLC, Plano, TX (US)

(72) Inventors: Peter Rabkin, Cupertino, CA (US); Yingda Dong, San Jose, CA (US); Masaaki Higashitani, Cupertino, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 323 days.

This patent is subject to a terminal disclaimer.

(21) Appl. No.: 15/352,390

(22) Filed: Nov. 15, 2016

(65) Prior Publication Data

US 2017/0062068 A1 Mar. 2, 2017

Related U.S. Application Data

(63) Continuation of application No. 14/550,897, filed on Nov. 21, 2014, now Pat. No. 9,530,506.

(51) Int. Cl.
*G11C 16/34* (2006.01)
*G11C 16/10* (2006.01)
(Continued)

(52) U.S. Cl.
CPC ...... *G11C 16/3427* (2013.01); *G11C 11/5628* (2013.01); *G11C 16/0483* (2013.01); *G11C 16/10* (2013.01); *G11C 16/3418* (2013.01)

(58) Field of Classification Search
CPC . G11C 16/3427; G11C 16/3418; G11C 16/10; G11C 11/5628; G11C 16/0483
See application file for complete search history.

(56) References Cited

U.S. PATENT DOCUMENTS 8,432,740 B2 4/2013 Li
9,455,263 B2 9/2016 Zhang
(Continued)

OTHER PUBLICATIONS

Office Action dated Oct. 1, 2015, U.S. Appl. No. 14/550,897.
(Continued)

*Primary Examiner* — David Lam
(74) *Attorney, Agent, or Firm* — Vierra Magen Marcus LLP

(57) ABSTRACT

Methods for improving channel boosting and reducing program disturb during programming of memory cells within a memory array are described. The memory array may comprise a NAND flash memory structure, such as a vertical NAND structure or a bit cost scalable (BiCS) NAND structure. In some cases, by applying continuous voltage ramping to unselected word lines during or throughout a programming operation, the boosting of channels associated with program inhibited memory cells may be improved. In one example, the slope and timing of a Vpass waveform applied to a group of unselected word lines (e.g., the neighboring word lines of the selected word line) during the programming operation may be set based on the location of the selected word line within the memory array and the locations of the group of unselected word lines within the memory array.

18 Claims, 18 Drawing Sheets

(51) Int. Cl.
  *G11C 11/56* (2006.01)
  *G11C 16/04* (2006.01)

(56) References Cited

U.S. PATENT DOCUMENTS

| | | |
|---|---|---|
| 9,530,506 B2 * | 12/2016 | Rabkin .................. G11C 16/10 |
| 2011/0103154 A1 | 5/2011 | Cho |
| 2011/0157995 A1 | 6/2011 | Bicksler |
| 2012/0033501 A1 | 2/2012 | Park |
| 2013/0010549 A1 * | 1/2013 | Aritome ............. G11C 16/0483 |
| | | 365/189.011 |
| 2013/0039125 A1 | 2/2013 | Kim |
| 2013/0182505 A1 * | 7/2013 | Liu ........................ G11C 16/10 |
| | | 365/185.17 |
| 2014/0254267 A1 | 9/2014 | Sakui |

OTHER PUBLICATIONS

Response to Office Action dated Feb. 1, 2016, U.S. Appl. No. 14/550,897.
Office Action dated May 10, 2016, U.S. Appl. No. 14/550,897.
Response to Office Action dated Aug. 9, 2016, U.S. Appl. No. 14/550,897.
Notice of Allowance dated Sep. 19, 2016, U.S. Appl. No. 14/550,897.
PCT International Search Report dated Dec. 10, 2015, PCT Patent Application No. PCT/US2015/052066.
PCT Written Opinion of the International Searching Authority dated Dec. 10, 2015, PCT Patent Application No. PCT/US2015/052066.

* cited by examiner

NAND BOOSTING USING DYNAMIC RAMPING OF WORD LINE VOLTAGES

CLAIM OF PRIORITY

This application is a continuation application of U.S. patent application Ser. No. 14/550,897, entitled Nand Boosting Using Dynamic Ramping Of Word Line Voltages," by Rabkin, et al., filed Nov. 21, 2014, which is incorporated herein by reference in its entirety.

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

Both flash memory and EEPROM utilize floating-gate transistors. For each floating-gate transistor, a floating gate is positioned above and insulated from a channel region of the floating-gate transistor. The channel region is positioned between source and drain regions of the floating-gate transistor. A control gate is positioned above and insulated from the floating gate. The threshold voltage of the floating-gate transistor may be controlled by setting the amount of charge stored on the floating gate. The amount of charge on the floating gate is typically controlled using Fowler-Nordheim tunneling or hot-electron injection. The ability to adjust the threshold voltage allows a floating-gate transistor to act as a non-volatile storage element or memory cell. In some cases, more than one data bit per memory cell (i.e., a multi-level or multi-state memory cell) may be provided by programming and reading multiple threshold voltages or threshold voltage ranges.

NAND flash memory structures typically arrange multiple floating-gate transistors in series with and between two select gates. The floating-gate transistors in series and the select gates may be referred to as a NAND string. In recent years, NAND flash memory has been scaled in order to reduce cost per bit. However, as process geometries shrink, many design and process challenges are presented. These challenges include increased leakage currents, such as increased leakage currents through select gate transistors of a NAND string.

DETAILED DESCRIPTION

Figure 1:
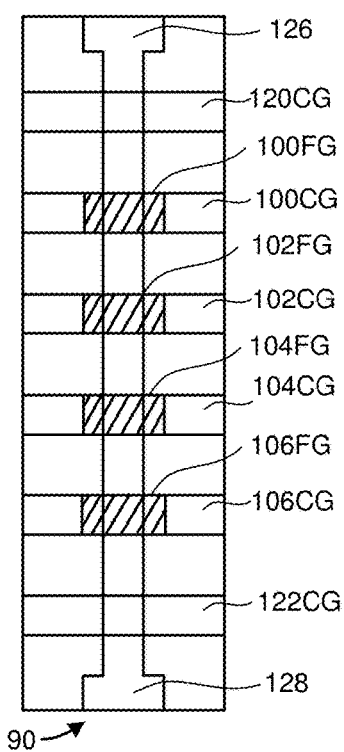
FIG. 1 depicts one embodiment of a NAND string.

Technology is described for improving channel boosting and reducing program disturb during programming of memory cells within a memory array. The memory array may comprise a NAND flash memory structure, such as a vertical NAND structure or a bit cost scalable (BiCS) NAND structure. In some cases, by applying continuous voltage ramping to unselected word lines during or throughout a programming operation, the boosting of channels associated with program inhibited memory cells may be improved. In one example, the slope and timing of a Vpass waveform applied to a group of unselected word lines (e.g., the neighboring word lines of the selected word line) during the programming operation may be set based on the location of the selected word line within the memory array and the locations of the group of unselected word lines within the memory array. In one embodiment, a first Vpass waveform including a first voltage ramp may be applied to the unselected word lines that are the neighboring word lines or directly adjacent to the selected word line (e.g., word lines N+1 and N−1 relative to the selected word line N) and a second Vpass waveform including a second voltage ramp that is less steep than the first voltage map may be applied to other unselected word lines, such as the unselected word lines that are neighboring word lines of the neighboring word lines to the selected word line (e.g., word lines N+2 and N−2 relative to the selected word line N).

In some embodiments, during programming of data into a set of memory cells within a memory array, a first Vpass waveform may be applied to a first grouping of unselected word lines within the memory array, a second Vpass waveform may be applied to a second grouping of unselected word lines within the memory array different from the first grouping, and a programming voltage (Vpgm) may be applied to a selected word line within the memory array. The first Vpass waveform may include a first initial ramp to a first initial voltage and then a first final ramp that ramps up between the first initial voltage and a Vpass voltage that is less than the programming voltage. The second Vpass waveform may include a second initial ramp to a second initial voltage and then a second final ramp that ramps up between the second initial voltage and the Vpass voltage. The first initial voltage may be different than the second initial voltage (e.g., the first initial voltage may be less than the second initial voltage). The first final ramp may have a different slope than the second final ramp (e.g., the first final ramp may be steeper than the second final ramp). The first initial ramp and the second initial ramp may both be substantially simultaneous with a voltage ramp of the selected word line to the programming voltage.

In some cases, applying a constant or "steady-state" Vpass voltage to unselected word lines during a programming operation may not provide adequate boosting of program inhibited memory cells. For example, due to channel leakage currents, such as leakage currents through select gate transistors of a BiCS NAND string or caused by carrier generation and recombination within the BiCS NAND string, the boosting potential may depend upon dynamic action or the voltage ramping of the unselected word lines to a Vpass voltage. Instead, if the unselected word lines are biased at a constant Vpass voltage, then the leakage currents may cause the channel boosting to recede, which may lead to program disturb. Thus, in some cases, adequate boosting may require sustained dynamic action or continuous voltage ramping being applied to the unselected word lines, rather than a constant application of a Vpass voltage to the unselected word lines. The Vpass voltage may comprise the maximum voltage applied to the unselected word lines during a programming operation.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 2-5 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate. The memory array may include rewriteable non-volatile memory cells, wherein each memory cell includes a reversible resistance-switching element without an isolation element in series with the reversible resistance-switching element (e.g., no diode in series with the reversible resistance-switching element).

In some embodiments, a non-volatile storage system may include a non-volatile memory that is monolithically formed in one or more physical levels of arrays of memory cells having an active area disposed above a silicon substrate. The non-volatile storage system may also include circuitry associated with the operation of the memory cells (e.g., decoders, state machines, page registers, or control circuitry for controlling the reading or programming of the memory cells). The circuitry associated with the operation of the memory cells may be located above the substrate or located within the substrate.

In some embodiments, a non-volatile storage system may include a monolithic three-dimensional memory array. The monolithic three-dimensional memory array may include one or more levels of memory cells. Each memory cell within a first level of the one or more levels of memory cells may include an active area that is located above a substrate (e.g., above a single-crystal substrate or a crystalline silicon substrate). In one example, the active area may include a semiconductor junction (e.g., a P-N junction). The active area may include a portion of a source or drain region of a transistor. In another example, the active area may include a channel region of a transistor.

Figure 2:
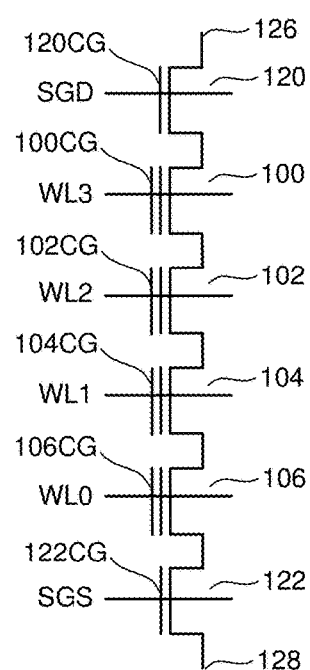
FIG. 2 depicts one embodiment of the NAND string of FIG. 1 using a corresponding circuit diagram.

FIG. 1 depicts one embodiment of a NAND string 90. FIG. 2 depicts one embodiment of the NAND string of FIG. 1 using a corresponding circuit diagram. As depicted, NAND string 90 includes four transistors, 100, 102, 104, and 106, in series between a first select gate 120 (i.e., a drain-side select gate) and a second select gate 122 (i.e., a source-side select gate). Select gate 120 connects the NAND string 90 to a bit line 126. Select gate 122 connects the NAND string 90 to a source line 128. Select gate 120 is controlled by applying the appropriate voltage to control gate 120CG (i.e., via select line SGD of FIG. 2). Select gate 122 is controlled by applying the appropriate voltage to control gate 122CG (i.e., via select line SGS of FIG. 2). Each of the transistors 100, 102, 104, and 106 includes a control gate and a floating gate. For example, transistor 100 includes control gate 100CG and floating gate 100FG, transistor 102 includes control gate 102CG and floating gate 102FG, transistor 104 includes control gate 104CG and floating gate 104FG, and transistor 106 includes control gate 106CG and floating gate 106FG. Control gates 100CG, 102CG, 104CG, and 106CG are connected to word lines WL3, WL2, WL1, and WL0, respectively.

Note that although FIGS. 1 and 2 show four floating-gate transistors in the NAND string, the use of four floating-gate transistors is only provided as an example. A NAND string may have less than or more than four floating-gate transistors (or memory cells). For example, some NAND strings may include 16 memory cells, 32 memory cells, 64 memory cells, 128 memory cells, etc. The discussion herein is not limited to any particular number of memory cells in a NAND string. One embodiment uses NAND strings with 66 memory cells, where 64 memory cells are used to store data and two of the memory cells are referred to as dummy memory cells because they do not store data.

A typical architecture for a flash memory system using a NAND flash memory structure includes a plurality of NAND strings within a memory block. A memory block may comprise a unit of erase. In some cases, the NAND strings within a memory block may share a common well (e.g., a P-well). Each NAND string may be connected to a common source line by its source-side select gate (e.g., controlled by select line SGS) and connected to its associated bit line by its drain-side select gate (e.g., controlled by select line SGD). Typically, each bit line runs on top of (or over) its associated NAND string in a direction perpendicular to the word lines and is connected to a sense amplifier.

In some embodiments, during a programming operation, storage elements that are not to be programmed (e.g., storage elements that have previously completed programming to a target data state) may be inhibited or locked out from programming by boosting associated channel regions (e.g., self-boosting the channel regions via word line coupling). An unselected storage element (or unselected NAND string) may be referred to as an inhibited or locked out storage element (or inhibited NAND string) as it is inhibited or locked out from programming during a given programming iteration of a programming operation.

Although technology using NAND-type flash memory is described herein, the technology disclosed herein may also be applied to other types of non-volatile storage devices and architectures (e.g., NOR-type flash memory). Moreover, although technology using floating-gate transistors is described herein, the technology described herein may also be applied to or used with other memory technologies including those that employ charge trapping, phase-change (e.g., chalcogenide materials), or state-change materials.

Figure 3A:
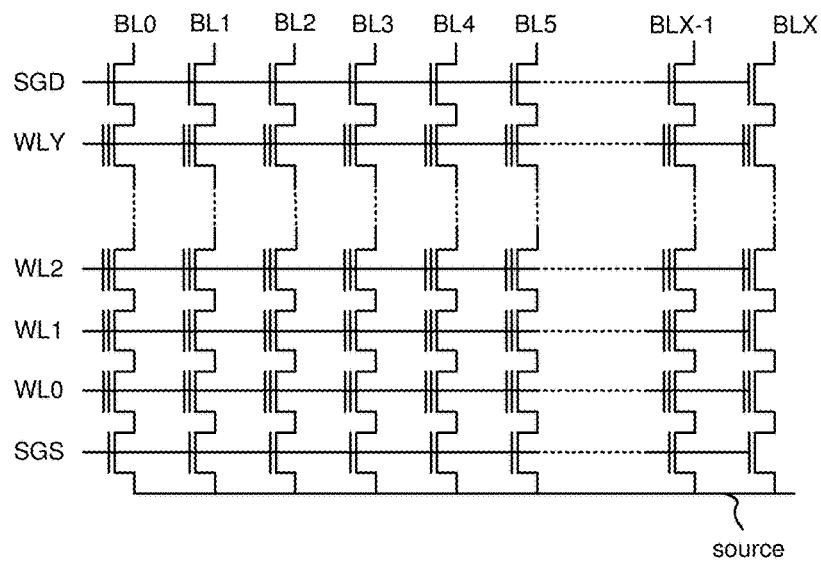
FIG. 3A depicts one embodiment of a memory block including a plurality of NAND strings.

FIG. 3A depicts one embodiment of a memory block including a plurality of NAND strings. As depicted, each NAND string includes (Y+1) memory cells. Each NAND string is connected to one bit line out of (X+1) bit lines on the drain side (i.e., one bit line of bit lines BL0-BLX) via a drain-side select gate controlled by the drain-side selection signal SGD. Each NAND string is connected to a source line (source) via a source-side select gate controlled by source-side selection signal SGS. In one embodiment, the source-side select gate controlled by source-side selection signal SGS and the drain-side select gate controlled by the drain-side selection signal SGD may comprise transistors without floating gates or transistors that include a floating gate structure. In some embodiments, the transistors within a NAND string may comprise transistors with a charge trapping layer.

In some embodiments, in order to save space on a semiconductor die, two adjacent NAND strings (or other grouping in memory cells) may share a common bit line (i.e., a shared-bit-line memory architecture). In some cases, more than two NAND strings may share a common bit line. In one example, the signal SGD may be replaced by two drain-side selection signals SGD1 and SGD2. Each NAND string of the pair would then have two drain-side select gates, each connected to a different drain-side selection signal of the two drain side selection signals SGD1 and SGD2. One of the two drain-side select gates for each NAND string may be a depletion mode transistor with its threshold voltage lower than 0 volts. One potential problem with using two select gates on the drain side of each NAND string is that two drain-side select gates (as compared to one drain-side select transistor) may require more die area, an increase in the number of fabrication layers, or an increase in the height of a memory device. Therefore, from an integrated circuit area standpoint, it may be beneficial to only use one drain-side selection gate for each NAND string and then connect each NAND string of the pair with only one of the two drain-side selection signals.

In one embodiment, during a programming operation, when programming a memory cell, such as a NAND flash memory cell, a program voltage may be applied to the control gate of the memory cell and the corresponding bit line may be grounded. These programming bias conditions may cause electrons to be injected into the floating gate (or into a charge storage layer, such as a silicon nitride charge trapping layer) via field-assisted electron tunneling, thereby raising the threshold voltage of the memory cell. The program voltage applied to the control gate during a program operation may be applied as a series of pulses. In some cases, the magnitude of the programming pulses may be increased with each successive pulse by a predetermined step size. Between programming pulses, one or more verify operations may be performed. During the programming operation, memory cells that have reached their intended programming states may be locked out and inhibited from programming by boosting the channel regions of the program inhibited memory cells.

In one embodiment, memory cells may be erased by raising the p-well to an erase voltage (e.g., 20 volts) for a sufficient period of time and grounding the word lines of a selected block of memory cells while the source and bit lines are floating. In the case of a vertical memory device (e.g., BiCS or other type of 3D NAND), the vertical channel in the memory string may be electrically connected to the substrate (e.g., via a p-well in the substrate) at the bottom of the memory hole (e.g., located below the SGS transistor). These erase bias conditions may cause electrons to be transferred from the floating gate through the tunneling oxide, thereby lowering the threshold voltage of the memory cells within the selected block. In some cases, an erase operation may be performed on an entire memory plane, on individual blocks within a memory plane, or another unit of memory cells.

In some embodiments, during verify operations and/or read operations, a selected word line may be connected (or biased) to a voltage, a level of which is specified for each read and verify operation in order to determine whether a threshold voltage of a particular memory cell has reached such level. After applying the word line voltage, the conduction current of the memory cell may be measured (or sensed) to determine whether the memory cell conducted a sufficient amount of current in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell may be measured by the rate it discharges or charges a dedicated capacitor in a sense amplifier. In another example, the conduction current of the selected memory cell allows (or fails to allow) the NAND string that included the memory cell to discharge a voltage on the corresponding bit line. The voltage of the bit line (or the voltage across a dedicated capacitor in a sense amplifier) may be measured after a period of time to determine whether the bit line has been discharged by a particular amount or not.

Figure 3B:
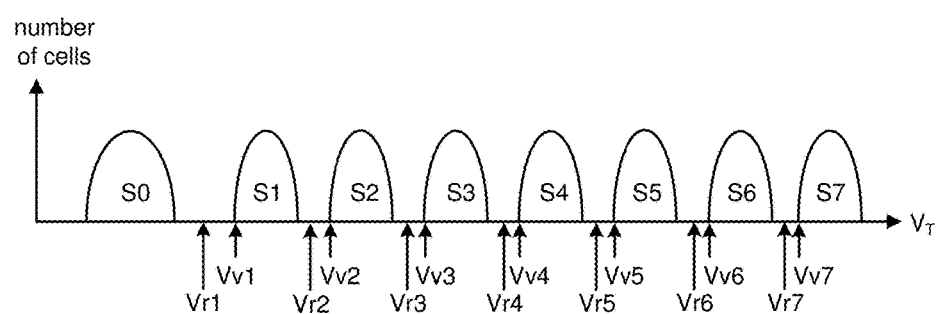
FIG. 3B depicts one embodiment of possible threshold voltage distributions for a three-bit-per-cell memory cell.

FIG. 3B depicts one embodiment of possible threshold voltage distributions (or data states) for a three-bit-per-cell memory cell (i.e., the memory cell may store three bits of data). Other embodiments, however, may use more than or less than three bits of data per memory cell (e.g., such as four or more bits of data per memory cell). At the end of a successful programming process (with verification), the threshold voltages of memory cells within a memory page or memory block should be within one or more threshold voltage distributions for programmed memory cells or within a distribution of threshold voltages for erased memory cells, as appropriate.

As depicted, each memory cell may store three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state S0-S7 corresponds to a unique value for the three bits stored in the memory cell. In one embodiment, S0=111, S1=110, S2=101, S3=100, S4=011, S5=010, S6=001 and S7=000. Other mappings of data to states S0-S7 can also be used. In one embodiment, all of the bits of data stored in a memory cell are stored in the same logical page. In other embodiments, each bit of data stored in a memory cell corresponds to different pages. Thus, a memory cell storing three bits of data would include data in a first page, a second page, and a third page. In some embodiments, all of the memory cells connected to the same word line would store data in the same three pages of data. In some embodiments, the memory cells connected to a word line can be grouped into different sets of pages (e.g., by odd and even bit lines).

In some example implementations, the memory cells will be erased to state S0. From state S0, the memory cells can be programmed to any of states S1-S7. Programming may be performed by applying a set of pulses with rising magnitudes to the control gates of the memory cells. Between pulses, a set of verify operations may be performed to determine whether the memory cells being programmed have reached their target threshold voltage (e.g., using verify levels Vv1, Vv2, Vv3, Vv4, Vv5, Vv6, and Vv7). Memory cells being programmed to state S1 will be tested to see if their threshold voltage has reached Vv1. Memory cells being programmed to state S2 will be tested to see if their threshold voltage has reached Vv2. Memory cells being programmed to state S3 will be tested to see if their threshold voltage has reached Vv3. Memory cells being programmed to state S4 will be tested to see if their threshold voltage has reached Vv4. Memory cells being programmed to state S5 will be tested to see if their threshold voltage has reached Vv5. Memory cells being programmed to state S6 will be tested to see if their threshold voltage has reached Vv6. Memory cells being programmed to state S7 will be tested to see if their threshold voltage has reached Vv7.

When reading memory cells that store three bits of data, multiple reads will be performed at read compare points Vr1, Vr2, Vr3, Vr4, Vr5, Vr6, and Vr7 to determine which state the memory cells are in. If a memory cell turns on in response to Vr1, then it is in state S0. If a memory cell turns on in response to Vr2 but does not turn on in response to Vr1, then it is in state S1. If a memory cell turns on in response to Vr3 but does not turn on in response to Vr2, then it is in state S2. If a memory cell turns on in response to Vr4 but does not turn on in response to Vr3, then it is in state S3. If a memory cell turns on in response to Vr5 but does not turn on in response to Vr4, then it is in state S4. If a memory cell turns on in response to Vr6 but does not turn on in response to Vr5, then it is in state S5. If a memory cell turns on in response to Vr7 but does not turn on in response to Vr6, then it is in state S6. If a memory cell does not turn on in response to Vr7, then it is in state S7.

Figure 3C:
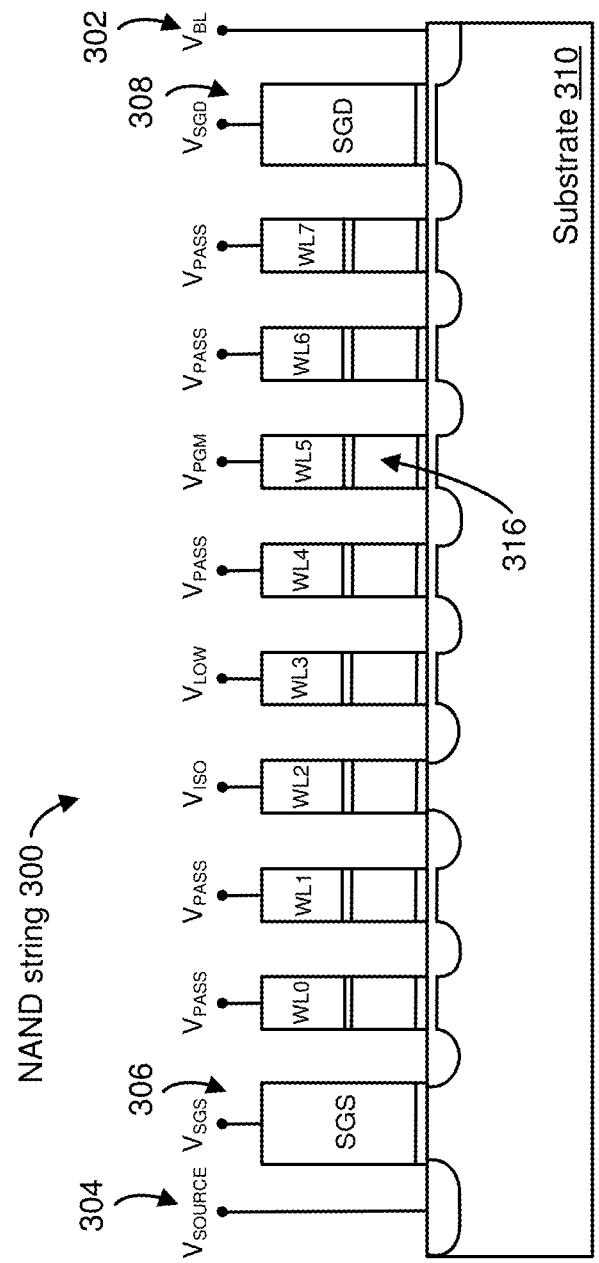
FIG. 3C depicts one embodiment of a NAND string during a programming operation.

FIG. 3C depicts one embodiment of a NAND string 300 during a programming operation. When programming a storage element (e.g., the storage element 316 associated with WL5) of the NAND string 300, a programming voltage may be applied to the selected word line associated with the storage element and a low voltage (e.g., ground) may be applied to the bit line associated with the storage element. As depicted, the NAND string 300 includes a source-side select gate 306, a drain-side select gate 308, and eight word lines WL0-WL7 formed above a substrate 310. $V_{SGS}$ may be applied to the source-side select gate 306 and $V_{SGD}$ may be applied to the drain-side select gate 308. The bit line 302 may be biased to VBA and the source line 304 may be biased to $V_{SOURCE}$. During a programming operation, a programming voltage, $V_{PGM}$, may be applied to selected word line WL5, which is associated with a selected storage element 316.

In one example of a boosting mode, when storage element 316 is the selected storage element, a relatively low voltage, $V_{LOW}$ (e.g., 2-6V) may be applied to a source-side word line (WL3), while an isolation voltage, $V_{ISO}$ (e.g., 0-4V) may be applied to another source-side word line (WL2), referred to as an isolation word line and a pass voltage, VPASS, may be applied to the remaining word lines associated with NAND string 300 (in this case word lines WL0, WL1, WL4, WL6, and WL7). While the absolute values of $V_{ISO}$ and $V_{LOW}$ may vary over a relatively large and partly overlapping range, $V_{ISO}$ may be less than $V_{LOW}$. In some cases, $V_{ISO}$ may be less than $V_{LOW}$ which is less than VPASS which is less than $V_{PGM}$.

Figure 4A:
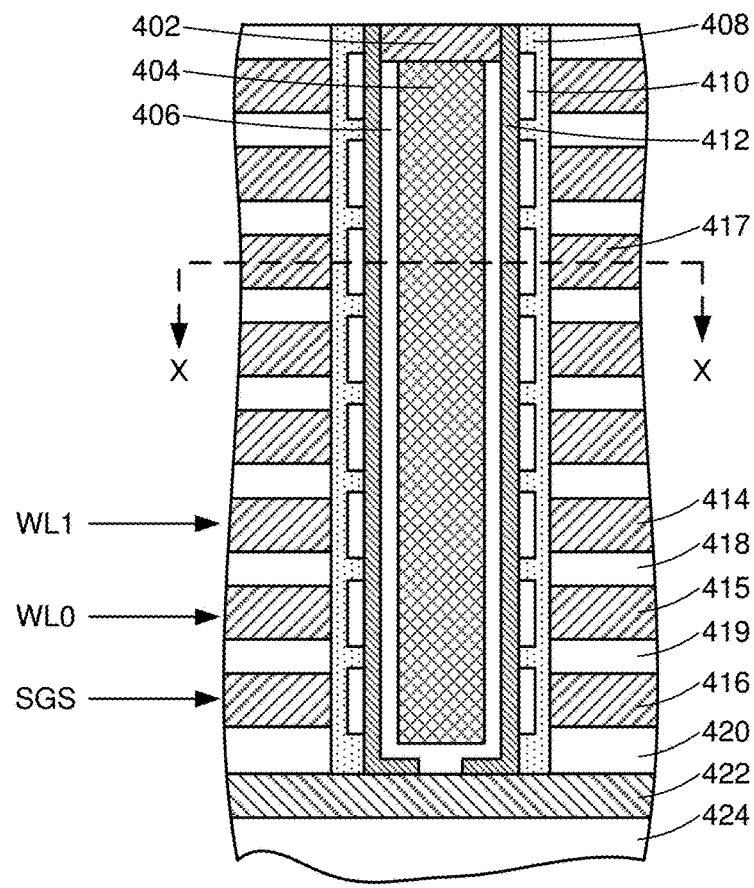
FIG. 4A depicts one embodiment of a vertical NAND structure.

FIG. 4A depicts one embodiment of a vertical NAND structure. The vertical NAND structure includes a vertical NAND string formed above the substrate 424 and oriented such that the vertical NAND string is orthogonal to the substrate 424. The vertical NAND string may be arranged within a vertical memory hole that is etched through alternating layers of control gate material (e.g., tungsten or polysilicon) and inter-gate insulator material (e.g., oxide or silicon oxide). As depicted, the layers of control gate material include layer 417 and layers 414-416 and the layers of inter-gate insulator material include layers 418-420. The inter-gate insulator material layer 420 may be arranged above a source line layer 422 (e.g., doped polysilicon) that may be arranged above a substrate 424 (e.g., a silicon substrate). In some cases, a first word line (WL1) may correspond with control gate layer 414, a second word line (WL0) may correspond with control gate layer 415, and a source-side select gate line (SGS) may correspond with control gate layer 416.

In one embodiment, within the memory hole a dielectric material 408 (e.g., oxide or a stack of dielectric layers, such as layers of $Al_2O_3$ and $SiO_2$), a floating gate material 410 (e.g., polysilicon), a tunneling layer material 412 (e.g., a thin oxide), and a channel layer material 406 (e.g., undoped polysilicon) may be deposited within the memory hole and arranged in order to form the vertical NAND string. The tunneling layer material 412 may comprise a portion of a multi-layer dielectric stack such as an ONO dielectric stack, which includes alternating layers of silicon dioxide ("O") and silicon nitride ("N"). In some cases, a core material layer 404 (e.g., oxide) may be formed within the memory hole. In other cases, the core material layer 404 may be omitted. A bit line contact layer 402 may be formed at the top of the memory hole and connect to the channel layer material 406. The channel layer material 406 may connect to the source line layer 422 at the bottom of the memory hole. Thus, in this case, the bit line contact layer 402 connects to the vertical NAND string at the top of the memory hole and the source line contact layer 422 connects to the vertical NAND string at the bottom of the memory hole. In some embodiments, the floating gate material 410 may be replaced with a charge storage material or a charge trapping layer (e.g., silicon nitride).

Figure 4B:
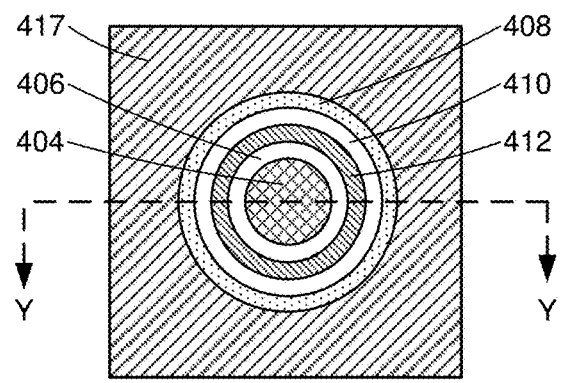
FIG. 4B depicts one embodiment of a cross-sectional view taken along line X-X of FIG. 4A.

FIG. 4B depicts one embodiment of a cross-sectional view taken along line X-X of FIG. 4A. As depicted, the vertical NAND string includes an inner core material layer 404 that is surrounded by the channel layer material 406 that is surrounded by the tunneling layer material 412 that is surrounded by the floating gate material 410 that is surrounded by the dielectric material 408 that is surrounded by the control gate material layer 417. In one embodiment, FIG.

4A may depict a cross-sectional view taken along line Y-Y of FIG. 4B. In one embodiment, the vertical NAND string may be formed using a vertical cylindrical structure or a vertical tapered cylindrical structure. In this case, the dielectric material 408, floating gate material 410, tunneling layer material 412, and channel layer material 406 of the vertical NAND string may comprise vertical annular structures surrounding the core material layer 404. In another embodiment, the vertical NAND string may be formed using a vertical pillar structure or a vertical rectangular prism structure. More information regarding 3D NAND structures may be found in U.S. patent application Ser. No. 14/317,274, entitled "Three Dimensional NAND Device with Channel Contacting Conductive Source Line and Method of Making Thereof," filed Jun. 27, 2014.

Figure 5:
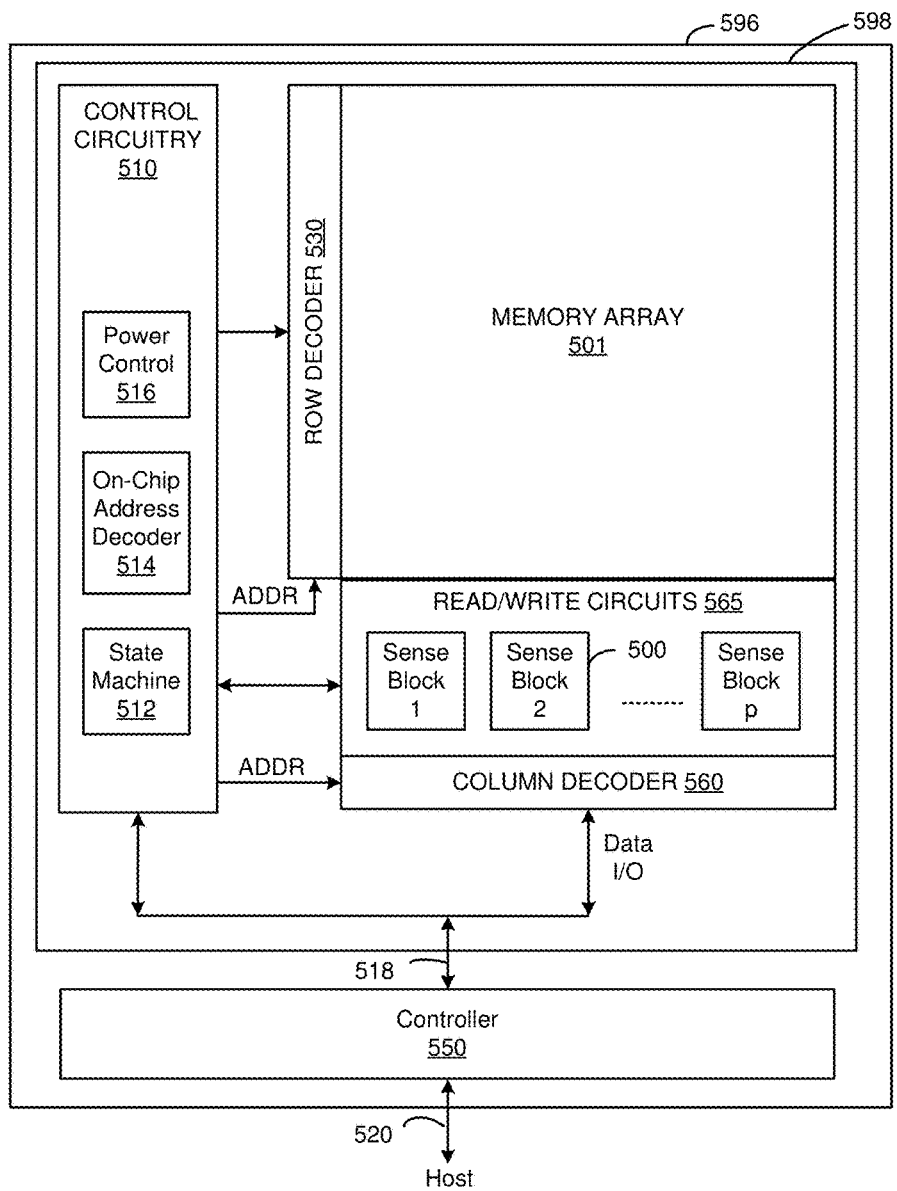
FIG. 5 depicts one embodiment of a non-volatile storage system.

FIG. 5 depicts one embodiment of a non-volatile storage system 596 including read/write circuits for reading and programming a page (or other unit) of memory cells (e.g., NAND multi-level cells) in parallel. As depicted, non-volatile storage system 596 includes a memory die 598 and controller 550. Memory die 598 includes a memory array 501 (e.g., a NAND flash memory array), control circuitry 510, row decoder 530, column decoder 560, and read/write circuits 565. In one embodiment, access to the memory array 501 by the various peripheral circuits (e.g., row decoders or column decoders) is implemented in a symmetric fashion, on opposite sides of the array, so that the densities of access lines and circuitry on each side are reduced by half. The memory array 501 is addressable by word lines via a row decoder 530 and by bit lines via a column decoder 560. Word lines and bit lines are examples of memory array control lines. The read/write circuits 565 include multiple sense blocks 500 that allow a page of storage elements to be read or programmed in parallel. In some cases, controller 550 may be integrated on the memory die 598. Commands and data are transferred between the host and controller 550 via lines 520 and between the controller 550 and the memory die 598 via lines 518.

The control circuitry 510 cooperates with the read/write circuits 565 to perform memory operations on the memory array 501. The control circuitry 510 includes a state machine 512, an on-chip address decoder 514, and a power control module 516. The state machine 512 provides chip-level control of memory operations. The on-chip address decoder 514 provides an address interface between that used by the host or a memory controller to the hardware address used by the decoders 530 and 560. The power control module 516 controls the power and voltages supplied to the word lines and bit lines during memory operations. In one embodiment, a power control module 516 includes one or more charge pumps that may generate voltages greater than the supply voltage.

In some embodiments, one or more of the components (alone or in combination), other than memory array 501, may be referred to as a managing or control circuit. For example, one or more managing or control circuits may include any one of or a combination of control circuitry 510, state machine 512, decoders 530/560, power control 516, sense blocks 500, read/write circuits 565, controller 550, and so forth. The one or more managing circuits may perform or facilitate one or more memory array operations including erasing, programming, or reading operations.

In one embodiment, memory array 501 may be divided into a large number of blocks (e.g., blocks 0-1023, or another amount) of memory cells. As is common for flash memory systems, the block may be the unit of erase. That is, each block may contain the minimum number of memory cells that are erased together. Other units of erase can also be used. A block contains a set of NAND strings which are accessed via bit lines and word lines. Typically, all of the NAND strings in a block share a common set of word lines.

Each block may be divided into a particular number of pages. In one embodiment, a page may be the unit of programming. Other units of programming can also be used. One or more pages of data are typically stored in one row of memory cells. For example, one or more pages of data may be stored in memory cells connected to a common word line. In one embodiment, the set of memory cells that are connected to a common word line are programmed simultaneously. A page can store one or more sectors. A sector may include user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECC and/or other overhead data may be stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages, and sectors can also be used.

Figure 6:
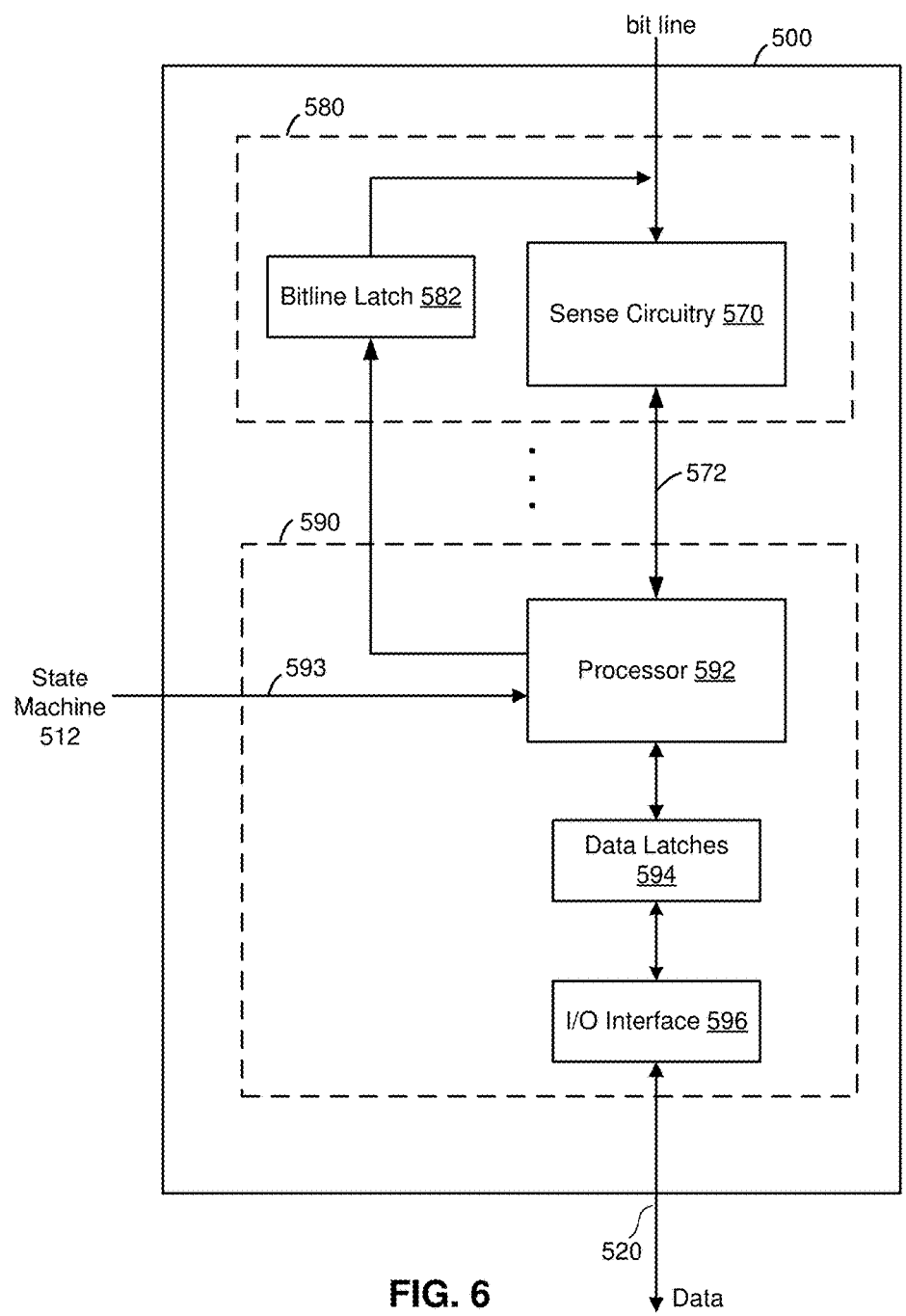
FIG. 6 depicts one embodiment of a sense block.

FIG. 6 depicts one embodiment of a sense block 500, such as sense block 500 in FIG. 5. An individual sense block 500 may be partitioned into a core portion, referred to as a sense module 580, and a common portion 590. In one embodiment, there is a separate sense module 580 for each bit line and one common portion 590 for a set of multiple sense modules 580. In one example, a sense block will include one common portion 590 and eight sense modules 580. Each of the sense modules in a group will communicate with the associated common portion via a data bus 572.

Sense module 580 comprises sense circuitry 570 that determines whether a conduction current in a connected bit line is above or below a predetermined threshold level. Sense module 580 also includes a bit line latch 582 that is used to set a voltage condition on the connected bit line. For example, a predetermined state latched in bit line latch 582 may result in the connected bit line being pulled to a state designating program inhibit voltage (e.g., 1.5-3 V).

Common portion 590 comprises a processor 592, a set of data latches 594, and an I/O Interface 596 coupled between the set of data latches 594 and data bus 520. Processor 592 performs computations. For example, processor 592 may determine the data stored in the sensed storage element and store the determined data in the set of data latches. The set of data latches 594 may be used to store data bits determined by processor 592 during a read operation or to store data bits imported from the data bus 520 during a program operation. The imported data bits represent write data meant to be programmed into a memory array, such as memory array 501 in FIG. 5. I/O interface 596 provides an interface between data latches 594 and the data bus 520.

During a read operation or other storage element sensing operation, a state machine, such as state machine 512 in FIG. 5, controls the supply of different control gate voltages to the addressed storage elements. As it steps through the various predefined control gate voltages corresponding to the various memory states supported by the memory, the sense module 580 may trip at one of these voltages and an output will be provided from sense module 580 to processor 592 via bus 572. At that point, processor 592 determines the resultant memory state by consideration of the tripping event(s) of the sense module and the information about the applied control gate voltage from the state machine via input lines 593. It then computes a binary encoding for the memory state and stores the resultant data bits into data latches 594. In another embodiment of the core portion, bit line latch 582 serves both as a latch for latching the output of the sense module 580 and as a bit line latch as described above.

During a programming operation, the data to be programmed is stored in the set of data latches 594. The programming operation, under the control of the state machine 512, comprises a series of programming voltage pulses applied to the control gates of the addressed storage elements. Each program pulse is followed by a read back (or verify process) to determine if the storage element has been programmed to the desired memory state. Processor 592 monitors the read back memory state relative to the desired memory state. When the two are in agreement, the processor 592 sets the bit line latch 582 so as to cause the bit line to be pulled to a state designating program inhibit voltage. This inhibits the storage element coupled to the bit line from further programming even if program pulses appear on its control gate. In other embodiments, the processor initially loads the bit line latch 582 and the sense circuitry sets it to an inhibit value during the verify process.

Data latch stack 594 contains a stack of data latches corresponding to the sense module. In one embodiment, there are three data latches per sense module 580. The data latches can be implemented as a shift register so that the parallel data stored therein is converted to serial data for data bus 520, and vice-versa. All the data latches corresponding to a read/write block can be linked together to form a block shift register so that a block of data can be input or output by serial transfer. In particular, the bank of read/write modules may be configured such that each of its set of data latches will shift data in to or out of the data bus in sequence as if they are part of a shift register for the entire read/write block.

Figure 7A:
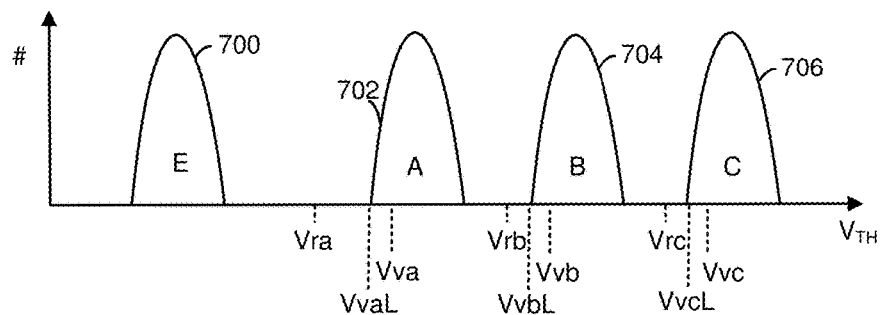
FIG. 7A depicts one embodiment of a set of threshold voltage distributions for a four-state memory device in which each storage element stores two bits of data.

FIG. 7A depicts one embodiment of a set of threshold voltage distributions for a four-state memory device in which each storage element stores two bits of data. A first threshold voltage (Vth) distribution 700 is provided for erased (E-state) storage elements. Three Vth distributions 702, 704 and 706 represent programmed states A, B and C, respectively. In one embodiment, the threshold voltages in the E-state and the threshold voltages in the A, B and C distributions are positive. In another embodiment, the threshold voltage distribution for the E-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the E-state directly to any of the programmed states A, B or C. For example, a population of storage elements to be programmed may first be erased so that all storage elements in the population are in the E-state. A series of program pulses, such as depicted in FIG. 7F, may then be used to program storage elements directly into states A, B or C. While some storage elements are being programmed from the E-state to the A-state, other storage elements are being programmed from the E-state to the B-state and/or from the E-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

Figure 7B:
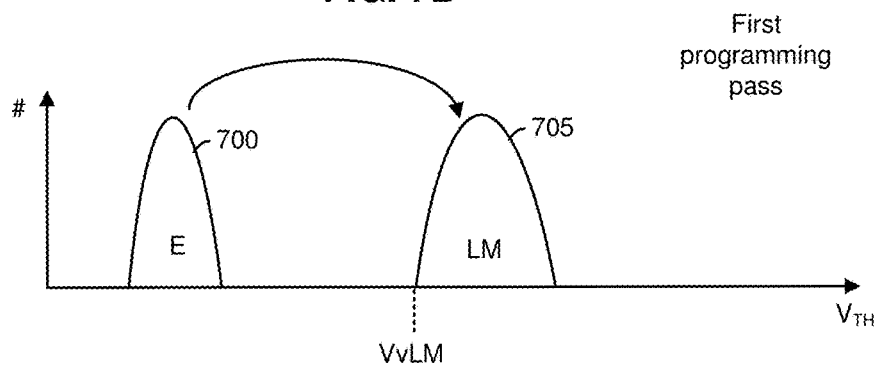
FIG. 7B depicts one embodiment of a first pass of a two-pass programming technique.

FIG. 7B depicts one embodiment of a first pass of a two-pass programming technique. In this example, a multi-state storage element stores data for two different pages: a lower page and an upper page. Four states are depicted by repeating the threshold voltage distributions 700, 702, 704 and 706 from FIG. 7A. These states, and the bits they represent, are: E-state (11), A-state (01), B-state (00) and C-state (10). For E-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state E (distribution 700). If the data is to be programmed to 0, then the threshold voltage of the storage elements on WLn are raised such that the storage element is programmed to an intermediate (LM or lower-middle) state (distribution 705).

Figure 9A:
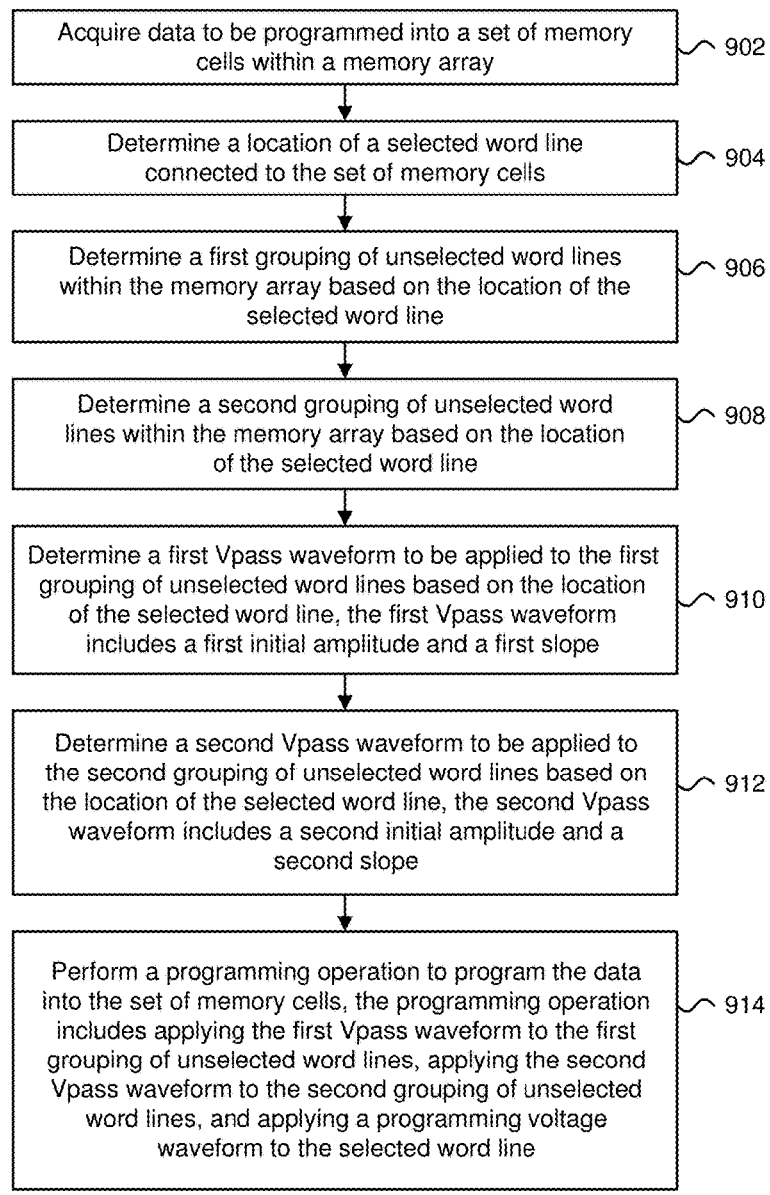
FIG. 9A is a flowchart describing one embodiment of a process for performing a programming operation.

In one embodiment, after a storage element is programmed from the E-state to the LM-state, as indicated by step "1" in FIG. 9A, its neighbor storage element on an adjacent word line WLn+1 in the NAND string will then be programmed with respect to its lower page in a respective first programming pass of the adjacent word line, as indicated by step "2" in FIG. 9A.

Figure 7C:
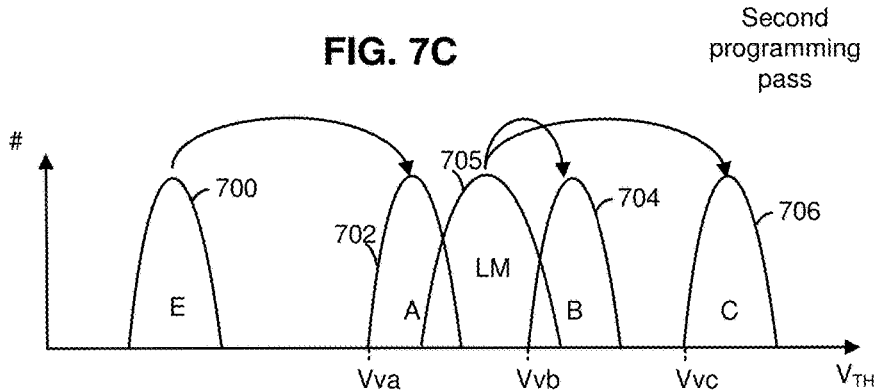
FIG. 7C depicts one embodiment of a second pass of the two-pass programming technique.

FIG. 7C depicts one embodiment of a second pass of the two-pass programming technique referred to in FIG. 7B. The A-state storage elements are programmed from the E-state distribution 700 to the A-state distribution 702, the B-state storage elements are programmed from the LM-state distribution 705 to the B-state distribution 704, and the C-state storage elements are programmed from the LM-state distribution 705 to the C-state distribution 706. The second pass of the two-pass programming technique for WLn is indicated by step "3" in FIG. 9A. The second pass of the two-pass programming technique for WLn+1 is indicated by step "5" in FIG. 9A.

Figure 7D:
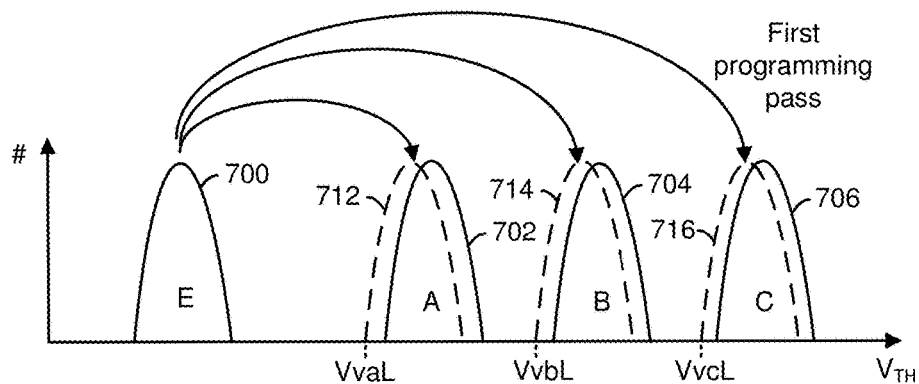
FIG. 7D depicts one embodiment of a first pass of another two-pass programming technique.

FIG. 7D depicts one embodiment of a first pass of another two-pass programming technique. In this example, referred to as foggy-fine (or course-fine) programming, the A-state, B-state and C-state storage elements are programmed from the E-state to distributions 712, 714 and 716, respectively, using lower verify levels VvaL, VvbL and VvcL, respectively. This is the foggy (or course) programming pass. A relatively large program voltage step size may be used, for instance, to quickly program the storage elements to the respective lower verify levels.

Figure 7E:
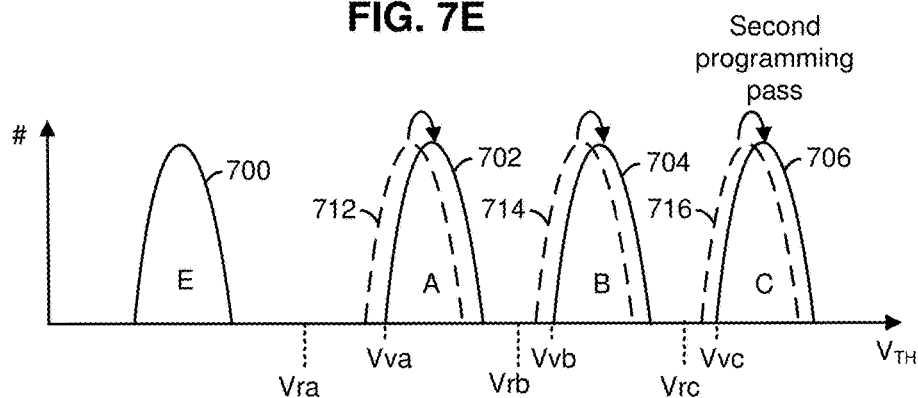
FIG. 7E depicts one embodiment of a second pass of the two-pass programming technique.
Figure 7F:
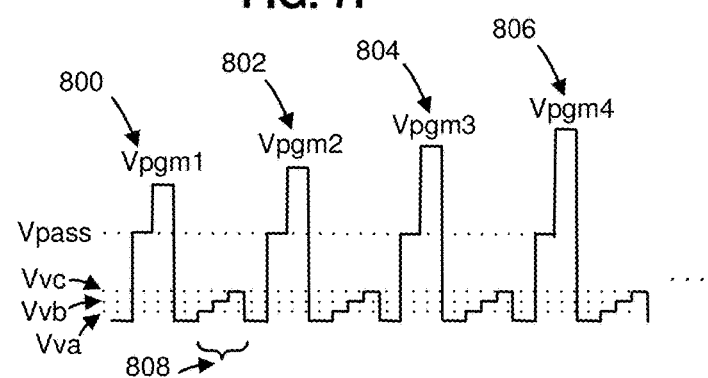
FIG. 7F depicts one embodiment of a series of program and verify pulses which are applied to a selected word line during a programming operation.

FIG. 7E depicts one embodiment of a second pass of the two-pass programming technique referred to in FIG. 7D. The A-state, B-state and C-state storage elements are programmed from the respective lower distributions to respective final distributions 702, 704 and 706, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 7F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 6-8 V, followed by a second, highest amplitude portion at a program level, e.g., 12-25 V. For example, a first, second, third and fourth program pulses 800, 802, 804 and 806 have program levels of Vpgm1, Vpgm2, Vpgm3 and Vpgm4, respectively. One or more verify voltages 808, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 8A:
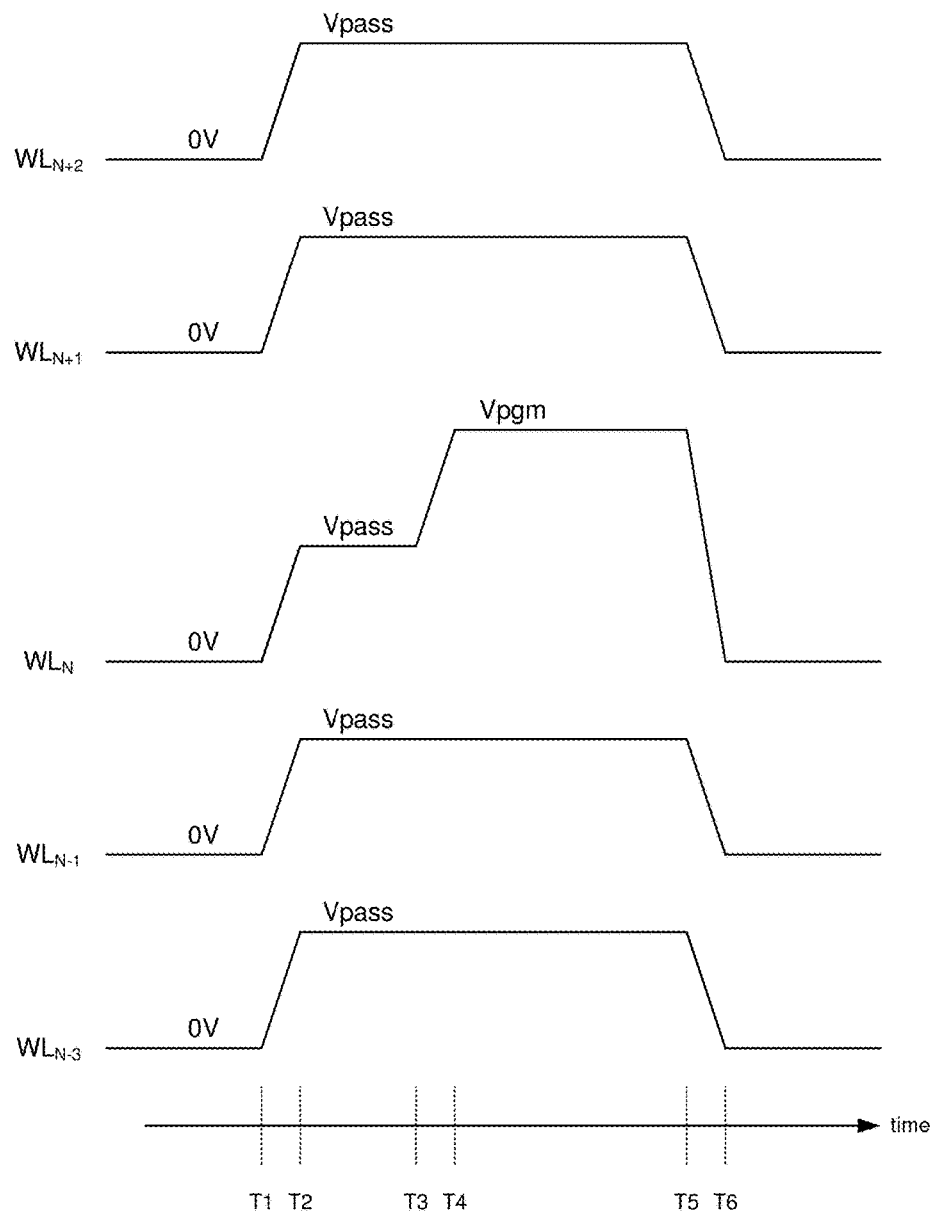
FIGS. 8A-8K depict various embodiments of sets of voltage waveforms applied to a set of word lines during a programming operation.

FIG. 8A depicts one embodiment of a set of voltage waveforms applied to a set of word lines during a programming operation. As depicted, the voltage waveform applied to the selected word line ($WL_N$) ramps up from 0V to Vpass (e.g., 6-10V) between times T1 and T2 and ramps up from Vpass to Vpgm (e.g., 15V-20V) between times T3 and T4. The voltage waveforms applied to the unselected word lines ($WL_{N-3}$, $WL_{N-1}$, $WL_{N+1}$, $WL_{N+2}$) ramp up from 0V to Vpass between times T1 and T2. One reason for delaying the ramp up of the selected word line from Vpass to Vpgm to a point in time after the unselected word lines have already reached Vpass may be to reduce program disturb caused by a programming voltage being applied to a memory cell connected to the selected word line in an unselected string before adequate channel boosting inhibits the memory cell from being programmed.

Figure 8B:
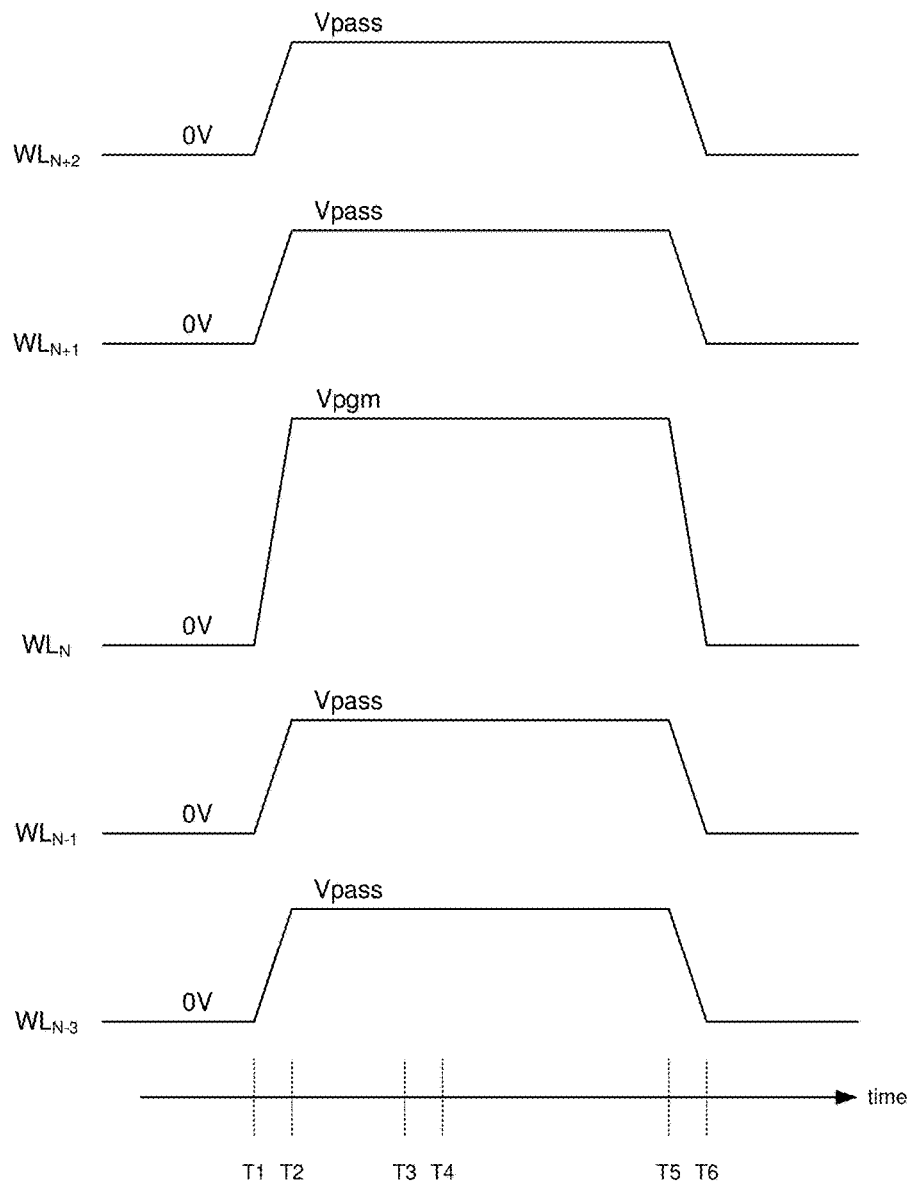

FIG. 8B depicts another embodiment of a set of voltage waveforms applied to a set of word lines during a programming operation. As depicted, the voltage waveform applied to the selected word line ($WL_N$) ramps up from 0V to Vpgm (e.g., 15V-20V) between times T1 and T2. The voltage waveforms applied to the unselected word lines ($WL_{N-3}$, $WL_{N-1}$, $WL_{N+1}$, $WL_{N+2}$) ramp up from 0V to Vpass (e.g., 6-10V) between times T1 and T2. In this case, the voltage waveform applied to the selected word line and the voltage waveforms applied to the unselected word lines include voltage ramp ups that are substantially simultaneous with each other. The voltage waveform applied to the selected word line and the voltage waveforms applied to the unselected word lines include voltage ramp ups that occur between times T1 and T2 and the selected word line is biased to Vpgm at substantially the same time that the unselected word lines are biased to Vpass. Thus, in some cases, the Vpass ramp up may be substantially simultaneous with the Vpgm ramp up. In one example, the time difference between T1 and T2 may be 1 □s and the time different between T2 and T5 may be 20 □s. In another example, the voltage ramps ups for the selected word line to Vpgm and the unselected word lines to Vpass may occur over 0.5 □s and the pulse widths of the voltage waveforms may be 10 □s.

Figure 8C:
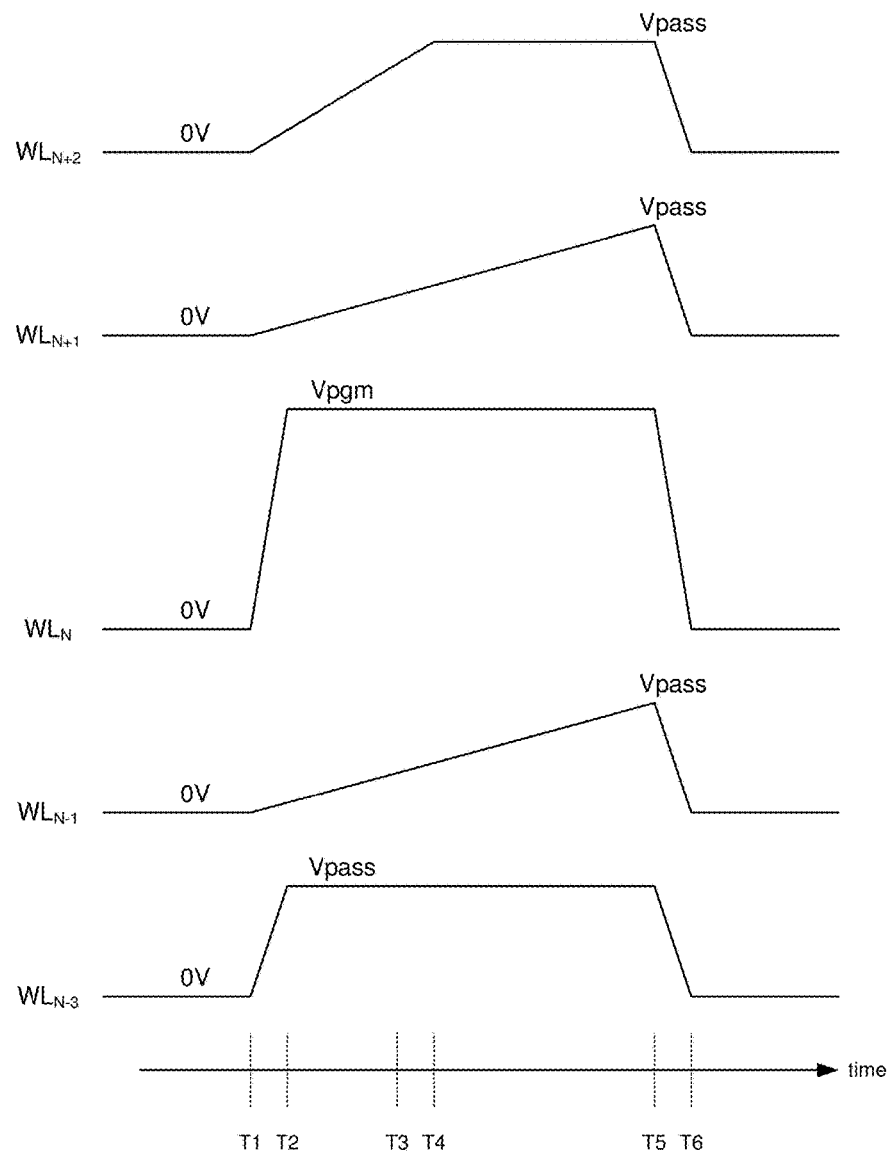

FIG. 8C depicts another embodiment of a set of voltage waveforms applied to a set of word lines during a programming operation. As depicted, the voltage waveform applied to the selected word line ($WL_N$) ramps up from 0V to Vpgm (e.g., 15V-20V) between times T1 and T2. The voltage waveforms applied to the neighboring unselected word lines of the selected word line ($WL_{N-1}$ and $WL_{N+1}$) ramp up from 0V to Vpass (e.g., 6-10V) between times T1 and T5. The voltage waveform applied to word line $WL_{N+2}$ ramps up from 0V to Vpass between times T1 and T4 (i.e., at a point in time prior to T5). The voltage waveforms applied to the other unselected word lines, such as word line $WL_{N-3}$, ramp up from 0V to Vpass between times T1 and T2. In this case, the voltage waveforms applied to the neighboring unselected word lines of the selected word line ($WL_{N-1}$ and $WL_{N+1}$) continuously ramp up from 0V to Vpass while the selected word line is biased to Vpgm. The voltage waveform applied to word line $WL_{N+2}$ ramps up while the selected word line is biased to Vpgm and reaches Vpass at a point in time prior to the neighboring unselected word lines of the selected word line ($WL_{N-1}$ and $WL_{N+1}$) reaching Vpass. In one example, the slope of the voltage waveform applied to $WL_N$ in FIG. 8C between times T1 and T2 may comprise a difference of 20V over 1 □s (or 15V over 0.5 □s) and the slope of the voltage waveform applied to $WL_{N+1}$ in FIG. 8C between times T1 an T5 may comprise a difference of 6V over 10 □s (or 8V over 20 □s).

In some embodiments, the slope of a voltage waveform, such as the voltage waveform applied to word line $WL_{N+1}$ in FIG. 8C, may be generated using a voltage regulator. The slope of the voltage waveform may be generated using a configurable RC network at the output of the voltage regulator or using a tunable resistor or transistor in series with the voltage regulator. In one example, the tunable resistor may be adjusted or set such that the slope of the output voltage waveform from the voltage regulator matches the slope of the desired voltage waveform. In one embodiment, the voltage waveform may be generated using a voltage regulator in which an internal regulation point within the voltage regulator or a node within the voltage regulator through which closed-loop feedback is used to generate the desired voltage waveform may be adjusted over time using a predetermined waveform schedule (e.g., stored in a non-volatile memory) in order to generate the desired voltage waveform with the desired slope. The output of the voltage regulator may be buffered (e.g., using a unity gain buffer) prior to driving one or more word lines (e.g., prior to driving the two neighboring unselected word lines that are adjacent to the selected word line).

Figure 8D:
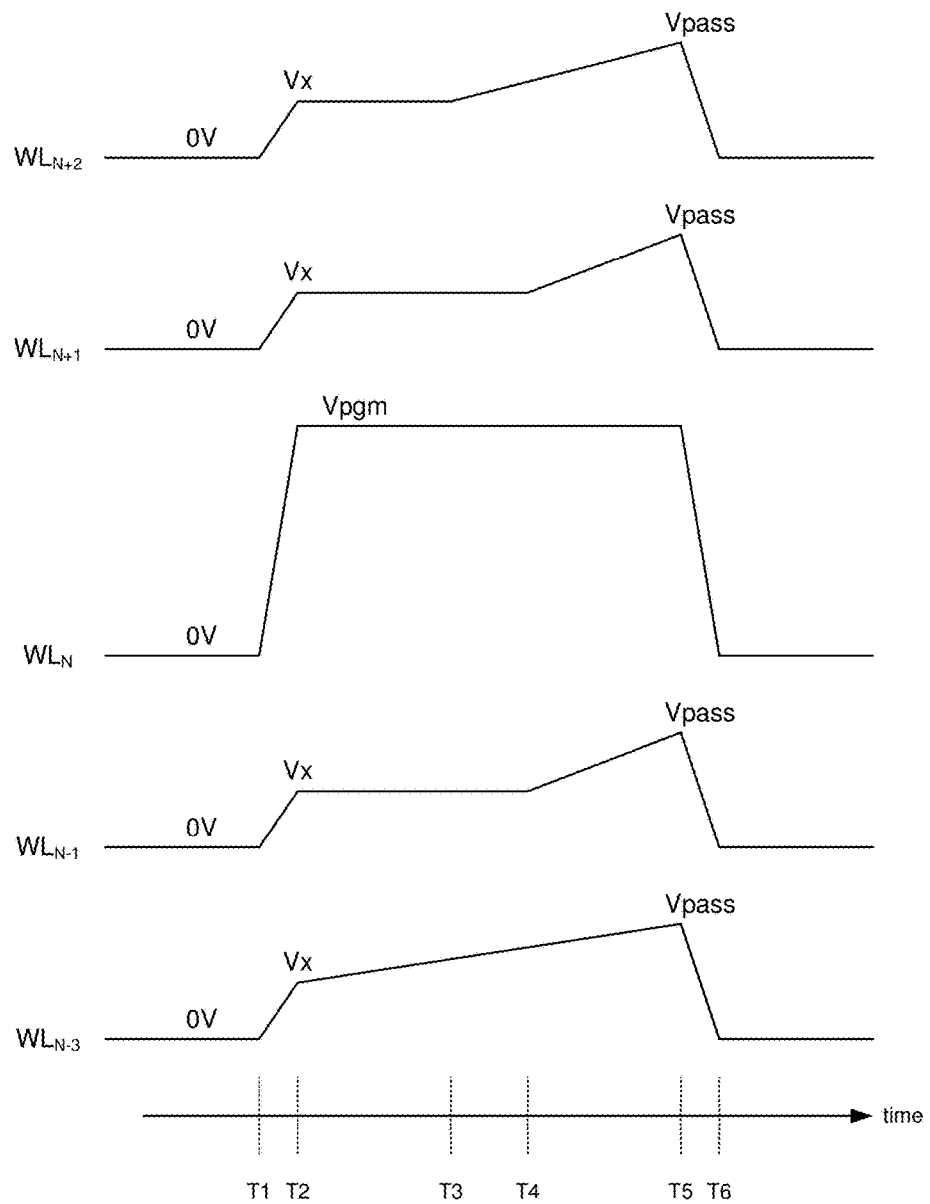

FIG. 8D depicts another embodiment of a set of voltage waveforms applied to a set of word lines during a programming operation. As depicted, the voltage waveform applied to the selected word line ($WL_N$) ramps up from 0V to Vpgm (e.g., 15V-20V) between times T1 and T2. The voltage waveforms applied to the neighboring unselected word lines of the selected word line ($WL_{N-1}$ and $WL_{N+1}$) ramp up from 0V to Vx (e.g., a voltage less than Vpass, such as 2-3V) between times T1 and T2 and then ramp up from Vx to Vpass (e.g., 6-10V) between times T4 and T5. The voltage waveform applied to word line $WL_{N+2}$ ramps from 0V to Vx between times T1 and T2 and then ramps up from Vx to Vpass between times T3 and T5. The voltage waveforms applied to the other unselected word lines, such as word line $WL_{N-3}$, ramp up from 0V to Vx between times T1 and T2 and then ramp up from Vx to Vpass between times T2 and T5. In this case, the voltage waveforms applied to the neighboring unselected word lines of the selected word line ($WL_{N-1}$ and $WL_{N+1}$) have a steeper slope from Vx to Vpass than the voltage waveforms applied to $WL_{N+2}$ and $WL_{N-3}$ because the final ramp up to Vpass starts at a later point in time.

Figure 8E:
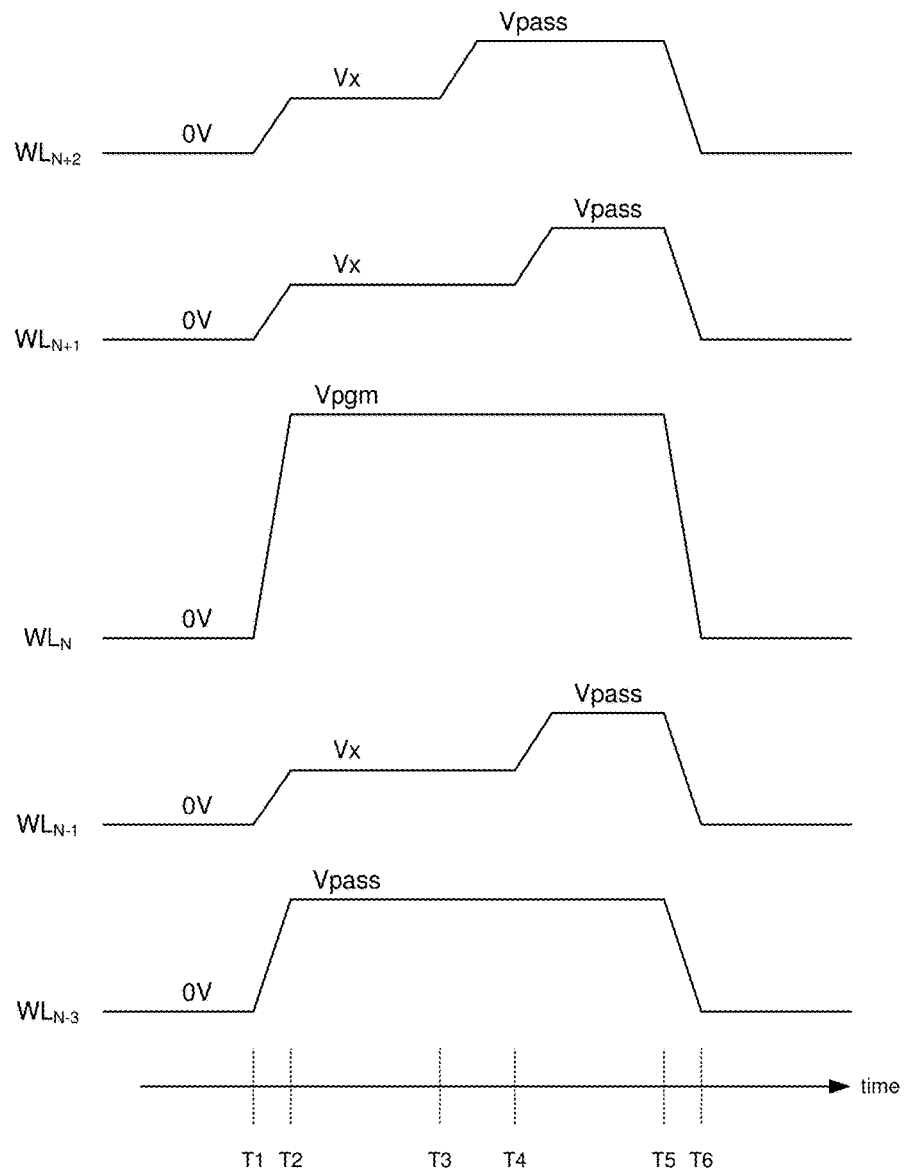

FIG. 8E depicts another embodiment of a set of voltage waveforms applied to a set of word lines during a programming operation. As depicted, the voltage waveform applied to the selected word line ($WL_N$) ramps up from 0V to Vpgm (e.g., 15V-20V) between times T1 and T2. The voltage waveforms applied to the neighboring unselected word lines of the selected word line ($WL_{N-1}$ and $WL_{N+1}$) ramp up from 0V to Vx (e.g., a voltage less than Vpass, such as 2-3V) between times T1 and T2 and then ramp up from Vx to Vpass (e.g., 6-10V) after time T4. The voltage waveform applied to word line $WL_{N+2}$ ramps up from 0V to Vx between times T1 and T2 and then ramps up from Vx to Vpass after time T3 and prior to time T4. The voltage waveforms applied to the other unselected word lines, such as word line $WL_{N-3}$, ramp up from 0V to Vpass between times T1 and T2. In this case, the voltage waveforms applied to the neighboring unselected word lines of the selected word line ($WL_{N-1}$ and $WL_{N+1}$) ramp up while both the selected word line is biased to Vpgm and word lines $WL_{N+2}$ and $WL_{N-3}$ are biased to Vpgm.

Figure 8F:
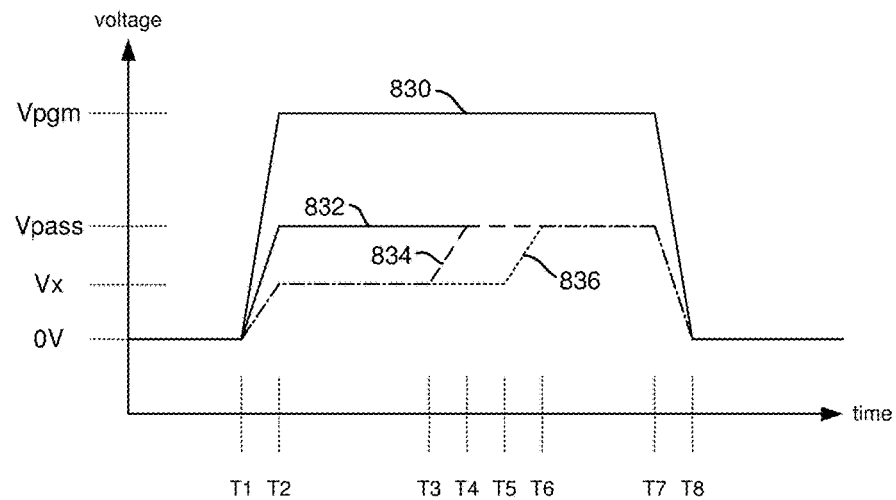

FIG. 8F depicts one embodiment of a set of voltage waveforms applied to a set of word lines during a programming operation. As depicted, the voltage waveform 836 ramps up from 0V to Vx (e.g., a voltage less than Vpass, such as 2-3V) between times T1 and T2 and then ramps up from Vx to Vpass (e.g., 6-10V) between times T5 and T6. The voltage waveform 834 ramps up from 0V to Vx between times T1 and T2 and then ramps up from Vx to Vpass between times T3 and T4. The voltage waveform 832 ramps up from 0V to Vpass between times T1 and T2. The voltage waveform 830 ramps up from 0V to Vpgm (e.g., 15V) between times T1 and T2.

In one embodiment, the voltage waveform 830 may be applied to a selected word line and voltage waveform 836 may be applied to neighboring unselected word lines of the selected word line (e.g., word lines $WL_{N+1}$ and $WL_{N-1}$ relative to the selected word line $WL_N$). The voltage waveform 834 may be applied to unselected word lines that are adjacent to the neighboring unselected word lines of the selected word line (e.g., word lines $WL_{N+2}$ and $WL_{N-2}$ relative to the selected word line $WL_N$). The voltage waveform 832 may be applied to all other unselected word lines (e.g., all unselected word lines except for $WL_{N+2}$, $WL_{N+1}$, $WL_{N-1}$, and $WL_{N-2}$ relative to the selected word line $WL_N$).

In another embodiment, the voltage waveform 830 may be applied to a selected word line and voltage waveform 832 may be applied to neighboring unselected word lines of the selected word line. The voltage waveform 834 may be applied to unselected word lines that are adjacent to the neighboring unselected word lines of the selected word line. The voltage waveform 836 may be applied to all other unselected word lines (e.g., all unselected word lines except for $WL_{N+2}$, $WL_{N+1}$, $WL_{N-1}$, and $WL_{N-2}$ relative to the selected word line $WL_N$).

Figure 8G:
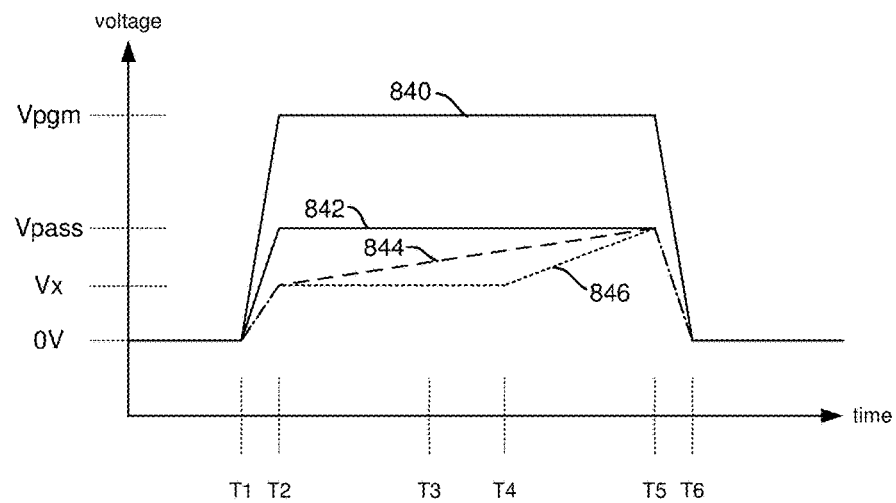

FIG. 8G depicts one embodiment of a set of voltage waveforms applied to a set of word lines during a programming operation. As depicted, the voltage waveform 846 ramps up from 0V to Vx (e.g., a voltage less than Vpass, such as 2-3V) between times T1 and T2 and then ramps up from Vx to Vpass (e.g., 6-10V) between times T4 and T5. The voltage waveform 844 ramps up from 0V to Vx between times T1 and T2 and then ramps up from Vx to Vpass between times T2 and T5. The voltage waveform 842 ramps up from 0V to Vpass between times T1 and T2. The voltage waveform 840 ramps up from 0V to Vpgm (e.g., 15V) between times T1 and T2. In this case, the voltage waveform 846 has a steeper slope from Vx to Vpass than voltage waveform 844 because the ramp up from Vx to Vpass begins at a later point in time.

In one embodiment, the voltage waveform 840 may be applied to a selected word line and voltage waveform 846 may be applied to neighboring unselected word lines of the selected word line (e.g., word lines $WL_{N+1}$ and $WL_{N-1}$ relative to the selected word line $WL_N$). The voltage waveform 844 may be applied to unselected word lines that are adjacent to the neighboring unselected word lines of the selected word line (e.g., word lines $WL_{N+2}$ and $WL_{N-2}$ relative to the selected word line $WL_N$). The voltage waveform 842 may be applied to all other unselected word lines (e.g., all unselected word lines except for $WL_{N+2}$, $WL_{N+1}$, $WL_{N-1}$, and $WL_{N-2}$ relative to the selected word line $WL_N$). In some cases, applying a voltage waveform to the unselected word lines adjacent to the selected word line that has a greater Vx to Vpass delay and a faster Vpass ramp up may lead to more efficient boosting (e.g., applying voltage waveform 846 to word lines $WL_{N+1}$ and $WL_{N-1}$ compared with voltage waveform 842 may lead to more efficient boosting).

In another embodiment, the voltage waveform 840 may be applied to a selected word line and voltage waveform 842 may be applied to neighboring unselected word lines of the selected word line. The voltage waveform 844 may be applied to unselected word lines that are adjacent to the neighboring unselected word lines of the selected word line. The voltage waveform 846 may be applied to all other unselected word lines (e.g., all unselected word lines except for $WL_{N+2}$, $WL_{N+1}$, $WL_{N-1}$, and $WL_{N-2}$ relative to the selected word line $WL_N$).

Figure 8H:
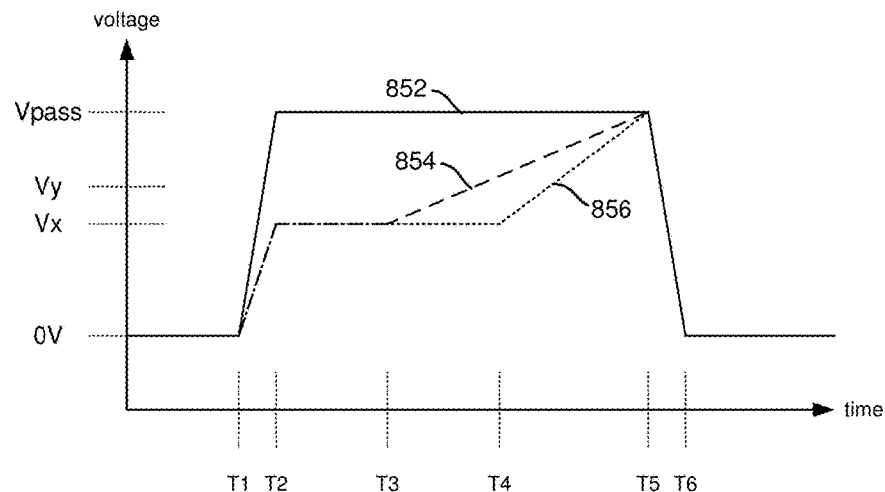

FIG. 8H depicts one embodiment of a set of voltage waveforms applied to a set of unselected word lines during a programming operation. As depicted, the voltage waveform 856 ramps up from 0V to Vx (e.g., a voltage less than Vpass, such as 2-3V) between times T1 and T2 and then ramps up from Vx to Vpass (e.g., 6-10V) between times T4 and T5. The voltage waveform 854 ramps up from 0V to Vx between times T1 and T2 and then ramps up from Vx to Vpass between times T3 and T5. The voltage waveform 852 ramps up from 0V to Vpass between times T1 and T2.

In one embodiment, the voltage waveform 856 may be applied to neighboring unselected word lines of the selected word line (e.g., word lines $WL_{N+1}$ and $WL_{N-1}$ relative to the selected word line $WL_N$). The voltage waveform 854 may be applied to unselected word lines that are adjacent to the neighboring unselected word lines of the selected word line (e.g., word lines $WL_{N+2}$ and $WL_{N-2}$ relative to the selected word line $WL_N$). The voltage waveform 852 may be applied to all other unselected word lines (e.g., all unselected word lines except for $WL_{N+2}$, $WL_{N+1}$, $WL_{N-1}$, and $WL_{N-2}$ relative to the selected word line $WL_N$).

In another embodiment, the voltage waveform 852 may be applied to neighboring unselected word lines of the selected word line. The voltage waveform 854 may be applied to unselected word lines that are adjacent to the neighboring unselected word lines of the selected word line. The voltage waveform 856 may be applied to all other unselected word lines (e.g., all unselected word lines except for $WL_{N+2}$, $WL_{N+1}$, $WL_{N-1}$, and $WL_{N-2}$ relative to the selected word line $WL_N$).

Figure 8I:
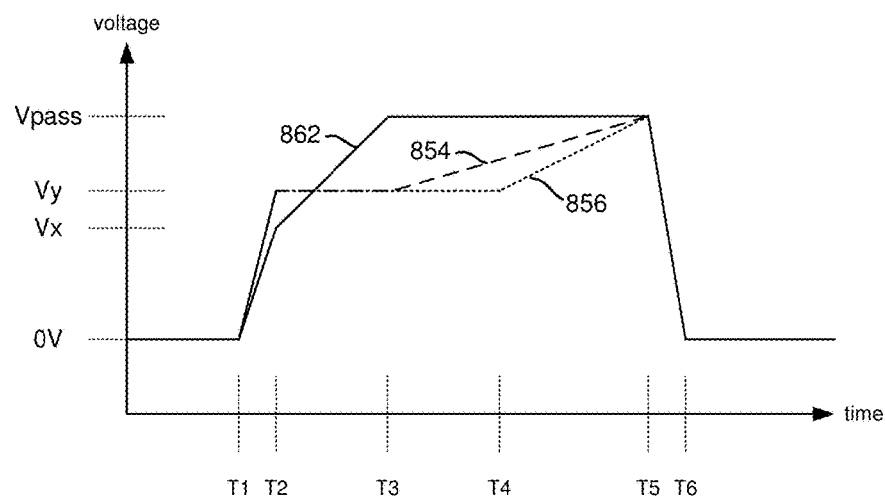

FIG. 8I depicts one embodiment of a set of voltage waveforms applied to a set of unselected word lines during a programming operation. As depicted, the voltage waveform 856 ramps up from 0V to Vy (e.g., a voltage less than Vpass but greater than voltage Vx, such as 4.5V) between times T1 and T2 and then ramps up from Vy to Vpass (e.g., 6-10V) between times T4 and T5. The voltage waveform 854 ramps up from 0V to Vy between times T1 and T2 and then ramps up from Vy to Vpass between times T3 and T5. The voltage waveform 862 ramps up from 0V to Vx (e.g., a voltage that is less than Vy and less than Vpass, such as 2V) between times T1 and T2 and then ramps up from Vx to Vpass between times T2 and T3.

In one embodiment, the voltage waveform 862 may be applied to all unselected word lines except for $WL_{N+2}$, $WL_{N+1}$, $WL_{N-1}$, and $WL_{N-2}$ relative to the selected word line $WL_N$ while voltage waveform 856 is applied to the neighboring unselected word lines of the selected word line (e.g., word lines $WL_{N+1}$ and $WL_{N-1}$ relative to the selected word line $WL_N$). In another embodiment, the voltage waveform 862 may be applied to the neighboring unselected word lines of the selected word line while voltage waveform 854 is applied to all unselected word lines except for $WL_{N+2}$, $WL_{N+1}$, $WL_{N-1}$, and $WL_{N-2}$ relative to the selected word line $WL_N$.

Figure 8J:
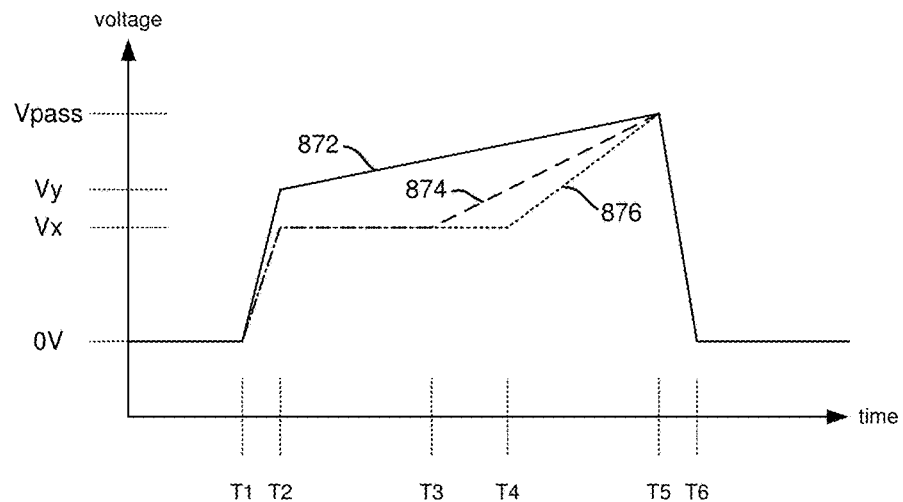

FIG. 8J depicts one embodiment of a set of voltage waveforms applied to a set of unselected word lines during a programming operation. As depicted, the voltage waveform 876 ramps up from 0V to Vx (e.g., a voltage less than Vpass, such as 2-3V) between times T1 and T2 and then ramps up from Vx to Vpass (e.g., 6-10V) between times T4 and T5. The voltage waveform 874 ramps up from 0V to Vx between times T1 and T2 and then ramps up from Vx to Vpass between times T3 and T5. The voltage waveform 872 ramps up from 0V to Vy (e.g., a voltage that is greater than Vx and less than Vpass, such as 4.5V) between times T1 and T2 and then ramps up from Vy to Vpass between times T2 and T5.

In one embodiment, the voltage waveform 876 may be applied to neighboring unselected word lines of the selected word line (e.g., word lines $WL_{N+1}$ and $WL_{N-1}$ relative to the selected word line $WL_N$). The voltage waveform 874 may be applied to unselected word lines that are adjacent to the neighboring unselected word lines of the selected word line (e.g., word lines $WL_{N+2}$ and $WL_{N-2}$ relative to the selected word line $WL_N$). The voltage waveform 872 may be applied to all other unselected word lines (e.g., all unselected word lines except for $WL_{N+2}$, $WL_{N+1}$, $WL_{N-1}$, and $WL_{N-2}$ relative to the selected word line $WL_N$).

In another embodiment, the voltage waveform 872 may be applied to neighboring unselected word lines of the selected word line. The voltage waveform 874 may be applied to unselected word lines that are adjacent to the neighboring unselected word lines of the selected word line. The voltage waveform 876 may be applied to all other unselected word lines (e.g., all unselected word lines except for $WL_{N+2}$, $WL_{N+1}$, $WL_{N-1}$, and $WL_{N-2}$ relative to the selected word line $WL_N$).

Figure 8K:
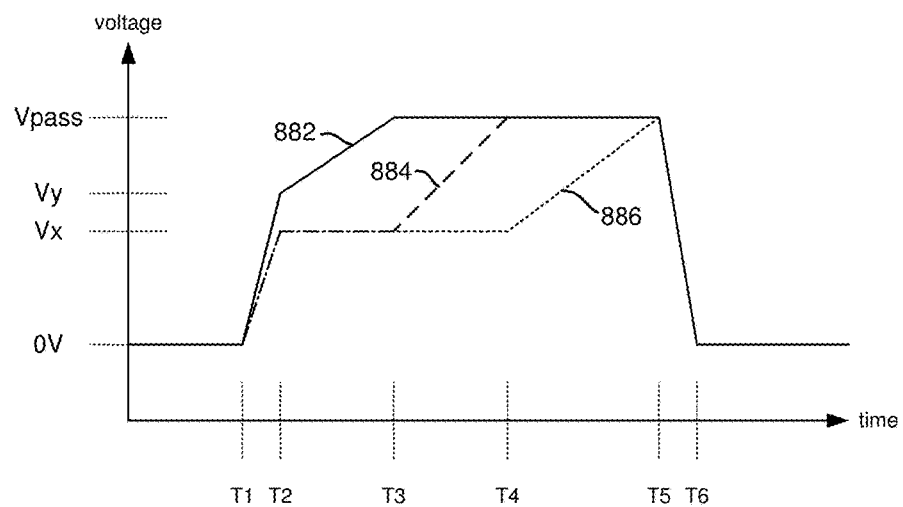

FIG. 8K depicts another embodiment of a set of voltage waveforms applied to a set of unselected word lines during a programming operation. As depicted, the voltage waveform 886 ramps up from 0V to Vx (e.g., a voltage less than Vpass, such as 2-3V) between times T1 and T2 and then ramps up from Vx to Vpass (e.g., 6-10V) between times T4 and T5. The voltage waveform 884 ramps up from 0V to Vx between times T1 and T2 and then ramps up from Vx to Vpass between times T3 and T4. The voltage waveform 882 ramps up from 0V to Vy (e.g., a voltage that is greater than Vx and less than Vpass, such as 4.5V) between times T1 and T2 and then ramps up from Vy to Vpass between times T2 and T3.

In one embodiment, the voltage waveform 886 may be applied to neighboring unselected word lines of the selected word line (e.g., word lines $WL_{N+1}$ and $WL_{N-1}$ relative to the selected word line $WL_N$). The voltage waveform 884 may be applied to unselected word lines that are adjacent to the neighboring unselected word lines of the selected word line (e.g., word lines $WL_{N+2}$ and $WL_{N-2}$ relative to the selected word line $WL_N$). The voltage waveform 882 may be applied to all other unselected word lines (e.g., all unselected word lines except for $WL_{N+2}$, $WL_{N+1}$, $WL_{N-1}$, and $WL_{N-2}$ relative to the selected word line $WL_N$).

In another embodiment, the voltage waveform 882 may be applied to neighboring unselected word lines of the selected word line. The voltage waveform 884 may be applied to unselected word lines that are adjacent to the neighboring unselected word lines of the selected word line. The voltage waveform 886 may be applied to all other unselected word lines (e.g., all unselected word lines except for $WL_{N+2}$, $WL_{N+1}$, $WL_{N-1}$, and $WL_{N-2}$ relative to the selected word line $WL_N$).

In one embodiment, a set of "string inward" Vpass dynamic ramp ups may be used in which a first voltage waveform applied to a first unselected word line ($WL_{N-1}$) adjacent to a selected word line ($WL_N$) may be biased to Vpass at a later point in time than a second voltage waveform applied to a second unselected word line ($WL_{N-2}$) adjacent to the first unselected word line ($WL_{N-1}$). In one example, if the selected word line is WL5 and is located next to the drain-side select gate, then the voltage waveform applied to WL4 may correspond with voltage waveform 846 of FIG. 8G and the voltage waveform applied to WL3 may correspond with voltage waveform 844 in FIG. 8G. In another example, if the selected word line is WL5 and is located next to the drain-side select gate, then the voltage waveform applied to WL4 may correspond with voltage waveform 836 of FIG. 8F and the voltage waveform applied to WL3 may correspond with voltage waveform 834 in FIG. 8F.

In another embodiment, a set of "string outward" Vpass dynamic ramp ups may be used in which a first voltage waveform applied to a first unselected word line ($WL_{N-1}$) adjacent to a selected word line ($WL_N$) may be biased to Vpass at an earlier point in time than a second voltage waveform applied to a second unselected word line ($WL_{N-2}$) adjacent to the first unselected word line ($WL_{N-1}$). In one example, if the selected word line is WL5 and is located next to the drain-side select gate, then the voltage waveform applied to WL4 may correspond with voltage waveform 844 of FIG. 8G and the voltage waveform applied to WL3 may correspond with voltage waveform 846 in FIG. 8G. In another example, if the selected word line is WL5 and is located next to the drain-side select gate, then the voltage waveform applied to WL4 may correspond with voltage waveform 834 of FIG. 8F and the voltage waveform applied to WL3 may correspond with voltage waveform 836 in FIG. 8F.

In one embodiment, a set of "odd/even" Vpass dynamic ramp ups may be used in which a first voltage waveform applied to odd unselected word lines ($WL_{N-1}$ and $WL_{N+1}$) may be biased to Vpass at a later point in time than a second voltage waveform applied to even unselected word lines ($WL_{N-2}$ and $WL_{N-4}$). In this case, the first voltage waveform may include a steeper slope than the second voltage waveform. In another embodiment, a set of "odd/even" Vpass dynamic ramp ups may be used in which a first voltage waveform applied to odd unselected word lines ($WL_{N-1}$ and $WL_{N+1}$) may be biased to Vpass at an earlier point in time than a second voltage waveform applied to even unselected word line ($WL_{N-2}$ and $WL_{N-4}$). In this case, the first voltage waveform may include a ramp up slope from an intermediate voltage (e.g., voltage Vx or voltage Vy in FIG. 8I) to Vpass that is steeper than a corresponding ramp up slope of the second voltage waveform.

In one embodiment, a first voltage waveform applied to odd unselected word lines ($WL_{N-1}$ and $WL_{N+1}$) may include a first initial amplitude (e.g., corresponding with voltages Vx in FIG. 8I) and a first slope and a second voltage waveform applied to even unselected word lines ($WL_{N-2}$ and $WL_{N-4}$) may include a second initial amplitude (e.g., corresponding with voltages Vy in FIG. 8I) and a second slope. The first initial amplitude may be different from or the same as the second initial amplitude (e.g., the first initial amplitude may be less than the second initial amplitude). The first slope may be different from the second slope (e.g., the first slope may be greater than the second slope).

In one embodiment, a first voltage waveform may be applied to a first grouping of unselected word lines (e.g., an unselected word line on a source-side of a selected word line) and a second voltage waveform different from the first voltage waveform may be applied to a second grouping of unselected word lines (e.g., an unselected word line on a drain-side of the selected word line). The first grouping of word lines may comprise one or more unselected word lines.

FIG. 9A is a flowchart describing one embodiment of a process for performing a programming operation. In one embodiment, the process of FIG. 9A may be performed by a non-volatile storage system, such as non-volatile storage system 596 in FIG. 5.

In step 902, data to be programmed into a set of memory cells within a memory array is acquired. The memory array may comprise a Flash memory array. The memory array may include a NAND flash memory structure, such as a vertical NAND structure or a bit cost scalable (BiCS) NAND structure. The data to be programmed may correspond with a page of data (e.g., 2 KB of data). In step 904, a location of a selected word line connected to the set of memory cells is determined. The location of the selected word line may correspond with the location of the selected word line relative to other word lines within the memory array. In some cases, the location of the selected word line may be associated with a word line number (e.g., word line four out of 64 word lines connected to 64 control gates in a NAND string). In step 906, a first grouping of unselected word lines within the memory array is determined based on the location of the selected word line. In one embodiment, the first grouping of unselected word lines may comprise two unselected word lines that are adjacent to the selected word line. In this case, the first grouping of unselected word lines corresponds with the two neighboring word lines of the selected word line and the selected word line is not the lowest word line (i.e., the word line closest to the source-side select gate) and is not the highest word line (i.e., the word line closest to the drain-side select gate). In another embodiment, the first grouping of unselected word lines may comprise the odd numbered word lines (or the even numbered word lines) within the memory array. In another embodiment, the first grouping of unselected word lines may include a first unselected word line on a source-side of the selected word line.

In step 908, a second grouping of unselected word lines within the memory array is determined based on the location of the selected word line. In one embodiment, the second grouping of unselected word lines may comprise two unselected word lines that are a distance of two word lines away from the selected word line. For example, the two unselected word lines that are a distance of two word lines away from the selected word line may correspond with word lines N+2 and N−2 relative to the selected word line N. In another embodiment, the second grouping of unselected word lines may comprise the even numbered word lines within the memory array if the first grouping of word lines comprises the odd numbered word lines (or the odd numbered word lines if the first grouping comprises the even numbered word lines). In another embodiment, the second grouping of unselected word lines may include a second unselected word line on a drain-side of the selected word line.

In step 910, a first Vpass waveform to be applied to the first grouping of unselected word lines is determined based on the location of the selected word line. The first Vpass waveform includes a first initial amplitude and a first slope. In step 912, a second Vpass waveform to be applied to the second grouping of unselected word lines is determined based on the location of the selected word line. The second Vpass waveform includes a second initial amplitude and a second slope. In one embodiment, if the selected word line is not the word line closest to the source-side select gate and is not the word line closest to the drain-side select gate, then the first Vpass waveform may correspond with voltage waveform 846 in FIG. 8G and the first grouping of unselected word lines may comprise the two neighboring word lines of the selected word line. The second Vpass waveform may correspond with voltage waveform 844 in FIG. 8G and the second grouping of unselected word lines may comprise all the other unselected word lines within the memory array. In this case, the first initial amplitude and the second initial amplitude may be the same (e.g., voltage Vx in FIG. 8G) and the first slope may be steeper than the second slope.

In another embodiment, if the selected word line is not the word line closest to the source-side select gate and is not the word line closest to the drain-side select gate, then the first Vpass waveform may correspond with voltage waveform 854 in FIG. 8H and the first grouping of unselected word lines may comprise the two neighboring word lines of the selected word line. The second Vpass waveform may correspond with voltage waveform 852 in FIG. 8H and the second grouping of unselected word lines may comprise all the other unselected word lines within the memory array. In this case, the first initial amplitude is different from the second initial amplitude (e.g., voltage Vx in FIG. 8H is less than voltage Vpass) and the first slope may be less steep than the second slope.

In another embodiment, the first Vpass waveform may correspond with voltage waveform 844 in FIG. 8G and the first grouping of unselected word lines may comprise the odd numbered unselected word lines within the memory array. The second Vpass waveform may correspond with voltage waveform 846 in FIG. 8G and the second grouping of unselected word lines may comprise the even numbered unselected word lines within the memory array. In this case, the first slope may be less steep than the second slope.

In step 914, a programming operation to program the data into the set of memory cells is performed. The programming operation includes applying the first Vpass waveform to the first grouping of unselected word lines, applying the second Vpass waveform to the second grouping of unselected word lines, and applying a programming voltage waveform to the selected word line. In one embodiment, the programming voltage waveform may correspond with voltage waveform 840 in FIG. 8G. During the programming operation, bit lines of the memory array may be set to program a first set of memory cells connected to the selected word line (e.g., a first set of the bit lines may be set to 0V) and/or set to inhibit programming of a second set of memory cells connected to the selected word line (e.g., a second set of the bit lines may be set to 2.5V).

Figure 9B:
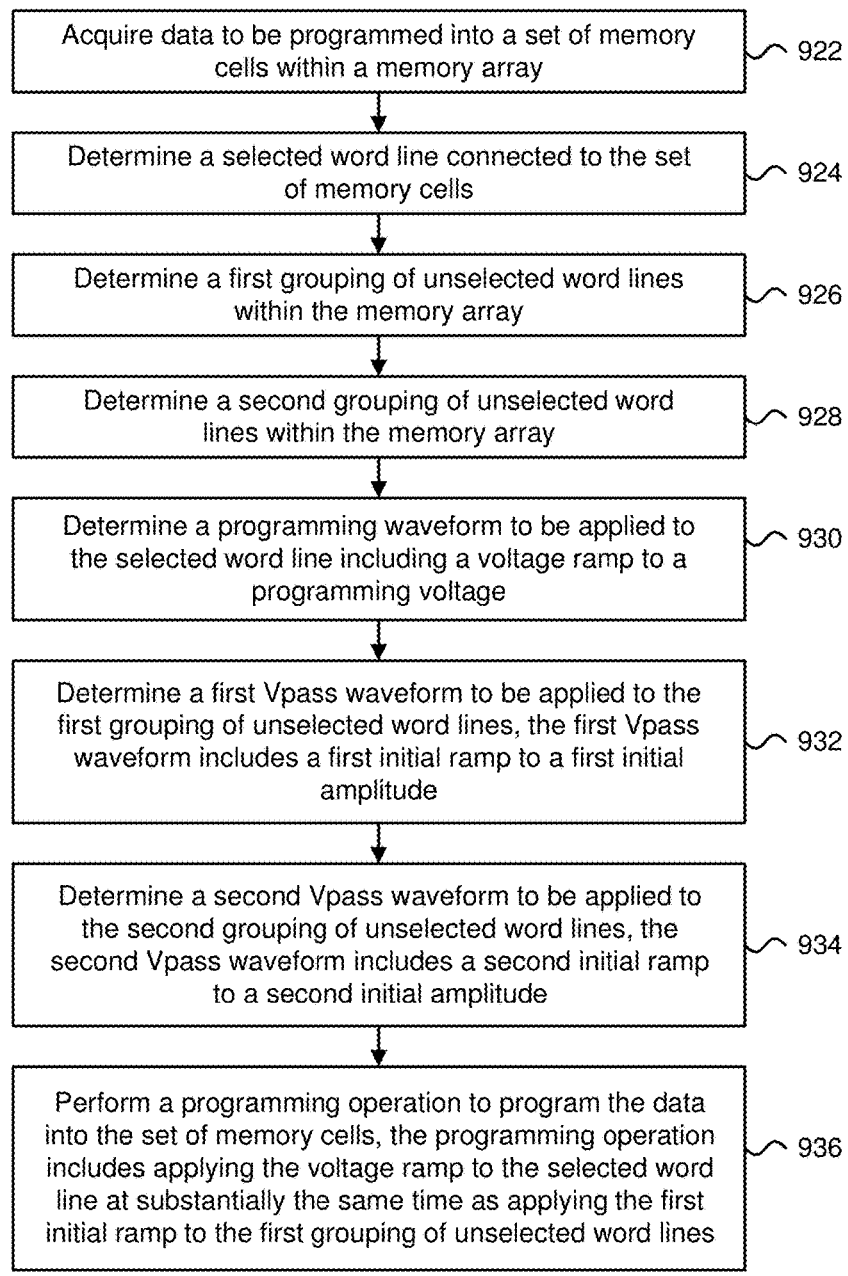
FIG. 9B is a flowchart describing an alternative embodiment of a process for performing a programming operation.

FIG. 9B is a flowchart describing an alternative embodiment of a process for performing a programming operation. In one embodiment, the process of FIG. 9B may be performed by a non-volatile storage system, such as non-volatile storage system 596 in FIG. 5.

In step 922, data to be programmed into a set of memory cells within a memory array is acquired. The memory array may comprise a Flash memory array. The memory array may include a NAND flash memory structure, such as a vertical NAND structure or a bit cost scalable (BiCS) NAND structure. The data to be programmed may correspond with a page of data (e.g., 4 KB of data). In step 924, a selected word line connected to the set of memory cells is determined. In step 926, a first grouping of unselected word lines within the memory array is determined. In step 928, a second grouping of unselected word lines within the memory array is determined. In step 930, a programming waveform to be applied to the selected word line is determined. The programming waveform includes a voltage ramp to a programming voltage. In step 932, a first Vpass waveform to be applied to the first grouping of unselected word lines is determined. The first Vpass waveform includes a first initial ramp to a first initial amplitude. In step 934, a second Vpass waveform to be applied to the second grouping of unselected word lines is determined. The second Vpass waveform includes a second initial ramp to a second initial amplitude. In one embodiment, the first initial amplitude may be greater than the second initial amplitude. The first initial ramp may have a steeper slope than the second initial ramp. In step 936, a programming operation to program the data into the set of memory cells is performed. The programming operation includes applying the voltage ramp to the selected word line at substantially the same time as applying the first initial ramp to the first grouping of unselected word lines. In one example, the first initial ramp may correspond with the ramp up of $WL_{N-1}$ to Vpass between times T1 and T2 in FIG. 8B and the voltage ramp may correspond with the ramp up of $WL_N$ to Vpgm between times T1 and T2 in FIG. 8B.

In one embodiment, the programming operation may include applying the voltage ramp to the selected word line at substantially the same time as applying the first initial ramp to the first grouping of unselected word lines and applying the second initial ramp to the second grouping of unselected word lines. In one example, the first initial ramp may correspond with the ramp up of $WL_{N+1}$ to Vx between times T1 and T2 in FIG. 8D, the second initial ramp may correspond with the ramp up of $WL_{N+2}$ to Vx between times T1 and T2 in FIG. 8D, and the voltage ramp may correspond with the ramp up of $WL_N$ to Vpgm between times T1 and T2 in FIG. 8D. Thus, in some cases, the first initial ramp and the second initial ramp applied to unselected word lines may ramp up with the voltage ramp applied to the selected word line at substantially the same time. In another embodiment, during the programming operation an edge of the voltage ramp applied to the selected word line may be substantially aligned with an edge of the first initial ramp to the first grouping of unselected word lines and substantially aligned with an edge of the second initial ramp to the second grouping of unselected word lines.

One embodiment of the disclosed technology includes acquiring data to be programmed into a set of memory cells within a memory array and determining a programming waveform to be applied to a selected word line connected to the set of memory cells. The programming waveform includes a voltage ramp to a programming voltage. The method further comprises determining a first voltage waveform to be applied to a first grouping of unselected word lines within the memory array. The first voltage waveform includes a first initial ramp to a first initial voltage and a first final ramp to a pass voltage. The pass voltage is greater than the first initial voltage. The pass voltage is less than the programming voltage. The method further comprises performing a programming operation to program the data into the set of memory cells. The programming operation includes applying the programming voltage waveform to the selected word line and applying the first voltage waveform to the first grouping of unselected word lines such that the first final ramp to the pass voltage occurs after the selected word line has been set to the programming voltage.

One embodiment of the disclosed technology includes a non-volatile storage system including a memory array and one or more managing circuits in communication with the memory array. The memory array includes a set of memory cells. The one or more managing circuits configured to acquire data to be programmed into the set of memory cells and configured to determine a programming waveform to be applied to a selected word line connected to the set of memory cells. The programming waveform includes a voltage ramp to a programming voltage. The one or more managing circuits configured to determine a first voltage waveform to be applied to a first grouping of unselected word lines within the memory array. The first voltage waveform includes a first initial ramp to a first initial voltage and a first final ramp to a pass voltage. The pass voltage is greater than the first initial voltage. The pass voltage is less than the programming voltage. The one or more managing circuits configured to initiate a programming operation to program the data into the set of memory cells. The one or more managing circuits configured to cause the programming voltage waveform to be applied to the selected word line during the programming operation and configured to cause the first voltage waveform to be applied to the first grouping of unselected word lines during the programming operation such that the first final ramp to the pass voltage occurs after the selected word line has been set to the programming voltage One embodiment of the disclosed technology includes acquiring data to be programmed into a set of floating gate transistors (or a set of memory cell transistors with a charge trapping layer) within a memory array and determining a programming waveform to be applied to a selected word line connected to the set of floating gate transistors. The programming waveform includes a voltage ramp to a programming voltage. The method further comprises determining a first voltage waveform to be applied to a first grouping of unselected word lines within the memory array. The first voltage waveform includes a first ramp to a pass voltage. The pass voltage is less than the programming voltage. The method further comprises performing a programming operation to program the data into the set of floating gate transistors (or the set of memory cell transistors with the charge trapping layer). The programming operation includes applying the programming voltage waveform to the selected word line and applying the first voltage waveform to the first grouping of unselected word lines such that the first ramp to the pass voltage occurs at substantially the same time as the voltage ramp to the programming voltage.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
a set of memory cells; and
one or more control circuits configured to determine a programming waveform to be applied to a selected word line connected to a selected memory cell of the set of memory cells and determine a first voltage waveform to be applied to an unselected word line connected to an unselected memory cell of the set of memory cells, the programming waveform includes a voltage ramp to a programming voltage, the first voltage waveform includes a first initial ramp to a first initial voltage and a first final ramp to a pass voltage, the pass voltage is greater than the first initial voltage, the pass voltage is less than the programming voltage, the one or more control circuits configured to cause the programming voltage waveform to be applied to the selected word line and the first voltage waveform to be applied to the unselected word line during a programming operation such that the first final ramp to the pass voltage occurs after the selected word line has been set to the programming voltage, the one or more control circuits configured to cause the first voltage waveform to be applied to the unselected word line during the programming operation such that a continuous voltage ramping of the unselected word line occurs for the remainder of the programming operation after the selected word line has been set to the programming voltage.

2. The apparatus of claim 1, wherein:
the one or more control circuits configured to determine a second voltage waveform to be applied to a second unselected word line connected to a second unselected memory cell of the set of memory cells, the second voltage waveform includes a second initial ramp to a second initial voltage and a second final ramp from the second initial voltage to the pass voltage, the one or more control circuits configured to cause the second voltage waveform to be applied to the second unselected word line during the programming operation such that the second final ramp to the pass voltage occurs after the selected word line has been set to the programming voltage.

3. The apparatus of claim 2, wherein:
the one or more control circuits configured to cause the second voltage waveform to be applied to the second unselected word line during the programming operation such that the second final ramp to the pass voltage occurs after the unselected word line has been set to the pass voltage.

4. The apparatus of claim 2, wherein:
the one or more control circuits configured to cause the second voltage waveform to be applied to the second unselected word line during the programming operation such that the second final ramp to the pass voltage occurs concurrent with the first final ramp to the pass voltage.

5. The apparatus of claim 2, wherein:
the selected word line is adjacent to the second unselected word line; and
the unselected word line is adjacent to the second unselected word line.

6. The apparatus of claim 1, wherein:
the first initial ramp to the first initial voltage is steeper than the first final ramp to the pass voltage.

7. The apparatus of claim 1, wherein:
the voltage ramp to the programming voltage is steeper than the first final ramp to the pass voltage.

8. The apparatus of claim 2, wherein:
the first final ramp to the pass voltage is steeper than the second final ramp to the pass voltage.

9. The apparatus of claim 1, wherein:
the set of memory cells are part of a three-dimensional memory array.

10. The apparatus of claim 1, wherein:
the set of memory cells comprise memory cell transistors in a NAND string.

11. A method, comprising:
determining a programming waveform to be applied to a selected word line connected to a selected memory cell transistor within a NAND string, the programming waveform includes a voltage ramp to a programming voltage;
determining a first voltage waveform to be applied to an unselected word line connected to an unselected memory cell transistor within the NAND string, the first voltage waveform includes a first initial ramp to a first initial voltage and a first final ramp to a pass voltage, the pass voltage is greater than the first initial voltage, the pass voltage is less than the programming voltage; and
applying the programming voltage waveform to the selected word line and the first voltage waveform to the unselected word line during a programming operation such that the first final ramp to the pass voltage occurs after the selected word line has reached the programming voltage, the applying the first voltage waveform to the unselected word line during the programming operation includes providing a continuous voltage ramping of the unselected word line after the selected word line has reached the programming voltage for the remainder of the programming operation.

12. The method of claim 11, further comprising:
determining a second voltage waveform to be applied to a second unselected word line connected to a second unselected memory cell transistor of the NAND string, the second voltage waveform includes a second initial ramp to a second initial voltage and a second final ramp from the second initial voltage to the pass voltage; and
applying the second voltage waveform to the second unselected word line during the programming operation such that the second final ramp to the pass voltage occurs after the selected word line has reached the programming voltage.

13. The method of claim 12, wherein:
the second voltage waveform is applied to the second unselected word line during the programming operation such that the second final ramp to the pass voltage occurs after the unselected word line has reached the pass voltage.

14. The method of claim 12, wherein:
the second voltage waveform is applied to the second unselected word line during the programming operation such that the second final ramp to the pass voltage overlaps in time with the first final ramp to the pass voltage.

15. The method of claim 12, wherein:
the selected word line is adjacent to the second unselected word line; and
the unselected word line is adjacent to the second unselected word line.

16. The method of claim 11, wherein:
the voltage ramp to the programming voltage is steeper than the first final ramp to the pass voltage.

17. A system, comprising:
a string of memory cells including a selected memory cell and an unselected memory cell; and
one or more control circuits configured to apply a programming voltage waveform to the selected memory cell and a first voltage waveform to the unselected memory cell during a programming operation, the programming waveform includes a voltage ramp to a programming voltage, the first voltage waveform includes a first final ramp to a pass voltage less than the programming voltage, the one or more control circuits configured to apply the programming voltage waveform to the selected memory cell and the first voltage waveform to the unselected memory cell during the programming operation such that the first final ramp to the pass voltage occurs after the selected memory cell has been set to the programming voltage and a continuous voltage ramping of the unselected word line occurs for the remainder of the programming operation after the selected word line has been set to the programming voltage.

18. The system of claim 17, wherein:
the voltage ramp to the programming voltage is steeper than the first final ramp to the pass voltage.

* * * * *